(12) United States Patent
Owa et al.

(10) Patent No.: US 10,310,747 B2
(45) Date of Patent: *Jun. 4, 2019

(54) MEMORY MANAGEMENT DEVICE AND METHOD

(71) Applicant: TOSHIBA MEMORY CORPORATION, Minato-ku (JP)

(72) Inventors: Tsutomu Owa, Kawasaki (JP); Masaki Miyagawa, Kawasaki (JP); Atsushi Kunimatsu, Funabashi (JP); Mari Takada, Tokyo (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/930,327

(22) Filed: Nov. 2, 2015

(65) Prior Publication Data

US 2016/0054938 A1 Feb. 25, 2016

Related U.S. Application Data

(63) Continuation of application No. 14/506,341, filed on Oct. 3, 2014, now Pat. No. 9,235,507, which is a
(Continued)

(30) Foreign Application Priority Data

Dec. 16, 2009 (JP) ................. 2009-285423

(51) Int. Cl.
*G06F 12/00* (2006.01)
*G06F 3/06* (2006.01)
(Continued)

(52) U.S. Cl.
CPC .......... *G06F 3/0616* (2013.01); *G06F 3/0661* (2013.01); *G06F 3/0679* (2013.01);
(Continued)

(58) Field of Classification Search
CPC .... G06F 3/0616; G06F 3/0661; G06F 3/0679; G06F 12/0246; G06F 2212/7201;
(Continued)

(56) References Cited

U.S. PATENT DOCUMENTS 5,184,124 A  2/1993  Molpus et al.
8,135,900 B2 3/2012 Kunimatsu et al.
(Continued)

FOREIGN PATENT DOCUMENTS

JP  7-146820  6/1995
JP  2001-266580  9/2001
(Continued)

OTHER PUBLICATIONS

U.S. Appl. No. 13/050,528, filed Mar. 17, 2011, published as 2012-0030413, Miyagawa, et al.
(Continued)

*Primary Examiner* — Kalpit Parikh
(74) *Attorney, Agent, or Firm* — Oblon, McClelland, Maier & Neustadt, L.L.P.

(57) ABSTRACT

According to one embodiment, a device includes a determination unit, compression unit, selecting unit, write updating unit, writing unit. The determination unit determines whether to compress write data based on specific information. The specific information including at least one of the type, number of accesses, access frequency and importance level of the write data. The compression unit compresses the write data when determining to compress the write data. The selecting unit selects a write region for the write data in nonvolatile memory based on the specific information. The write updating unit updates the specific information. The writing unit writes compressed write data into the write region when determining to compress the write data. The
(Continued)

writing unit writes uncompressed write data into the write region when not determining to compress the write data.

23 Claims, 14 Drawing Sheets

Related U.S. Application Data continuation of application No. 12/970,145, filed on Dec. 16, 2010, now Pat. No. 8,880,836.

(51) Int. Cl.
*G06F 12/02* (2006.01)
*H03M 7/30* (2006.01)

(52) U.S. Cl.
CPC .. *G06F 12/0246* (2013.01); *G06F 2212/7201* (2013.01); *G06F 2212/7202* (2013.01); *G06F 2212/7204* (2013.01); *G06F 2212/7211* (2013.01); *H03M 7/6088* (2013.01)

(58) Field of Classification Search
CPC ..... G06F 2212/7202; G06F 2212/7211; G06F 2212/7204; H03M 7/6088
See application file for complete search history.

(56) References Cited

U.S. PATENT DOCUMENTS

| | | | |
|---|---|---|---|
| 8,261,041 B2 | 9/2012 | Kunimatsu | |
| 8,612,692 B2 | 12/2013 | Yasufuku et al. | |
| 8,645,612 B2 | 2/2014 | Kunimatsu et al. | |
| 8,880,836 B2* | 11/2014 | Owa | G06F 12/0246 710/68 |
| 9,235,507 B2* | 1/2016 | Owa | G06F 12/0246 |
| 2006/0004957 A1 | 1/2006 | Hand et al. | |
| 2006/0212625 A1 | 9/2006 | Nakagawa et al. | |
| 2007/0156998 A1* | 7/2007 | Gorobets | G06F 12/0246 711/170 |
| 2007/0208893 A1 | 9/2007 | Azzarello et al. | |
| 2008/0162523 A1* | 7/2008 | Kraus | G06F 17/30339 |
| 2008/0228998 A1* | 9/2008 | Colecchia | G06F 3/0608 711/103 |
| 2008/0244164 A1* | 10/2008 | Chang | G06F 12/0246 711/103 |
| 2008/0263259 A1* | 10/2008 | Sadovsky | G06F 3/0613 711/100 |
| 2009/0172333 A1* | 7/2009 | Marcu | G06F 3/0611 711/165 |
| 2010/0064111 A1 | 3/2010 | Kunimatsu et al. | |
| 2010/0153630 A1* | 6/2010 | Yim | G06F 12/0246 711/103 |
| 2012/0030413 A1 | 2/2012 | Miyagawa et al. | |

FOREIGN PATENT DOCUMENTS

| | | |
|---|---|---|
| JP | 2004-227091 | 8/2004 |
| JP | 2008-217772 | 9/2008 |
| JP | 2008-242944 | 10/2008 |
| JP | 2009-527847 | 7/2009 |
| JP | 2009-230513 | 10/2009 |
| JP | 2010-518491 | 5/2010 |
| WO | WO 2007/097832 A1 | 8/2007 |
| WO | 2008/095134 A1 | 8/2008 |

OTHER PUBLICATIONS

U.S. Appl. No. 12/555,952, filed Sep. 9, 2009, published as 2010/0064111 A1, Kunimatsu, et al.

Office Action dated Aug. 6, 2013 in Japanese Patent Application No. 2009-285423 (with English translation).

* cited by examiner

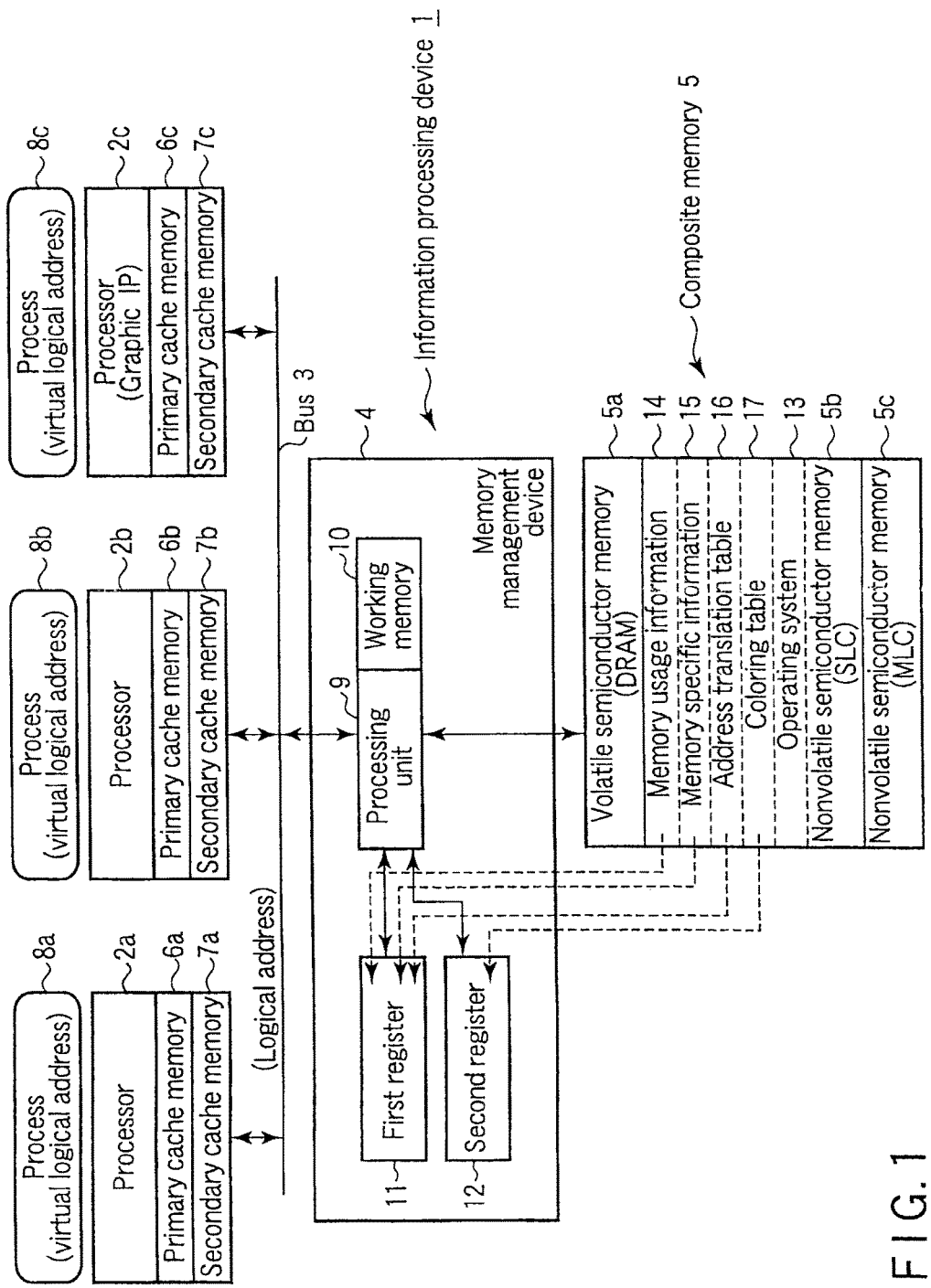
F I G. 1

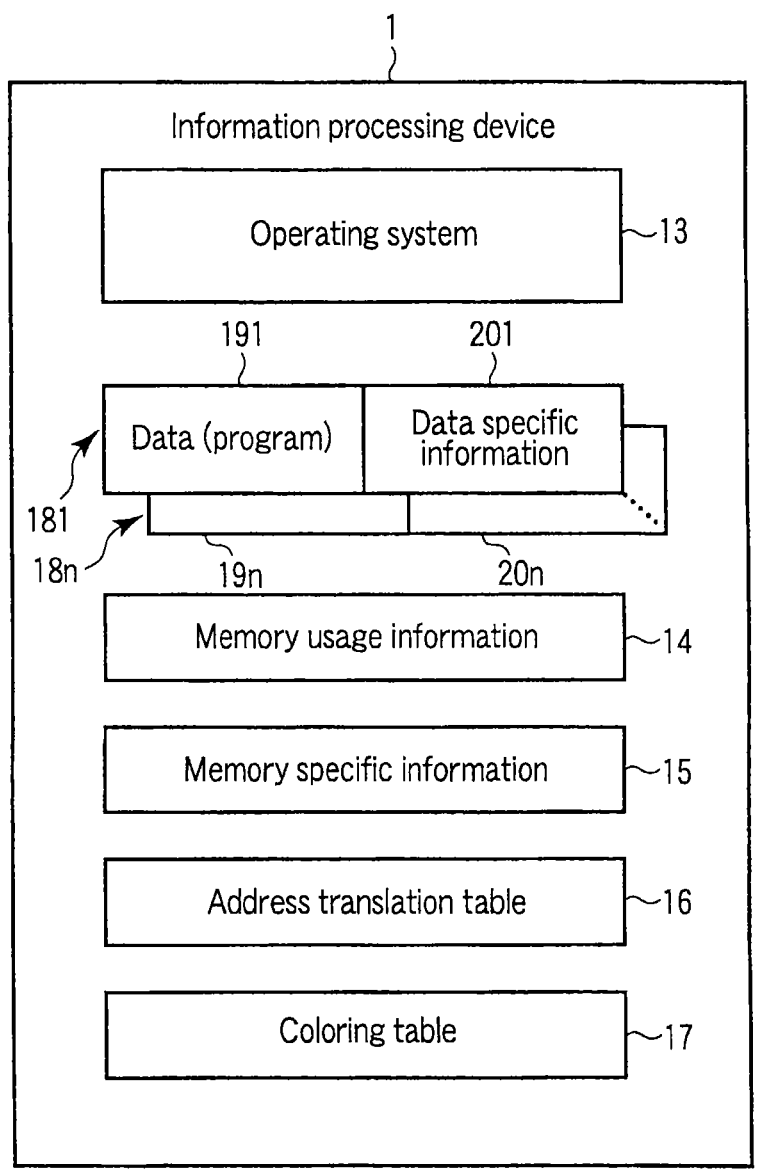
F I G. 2

| Compression determination information | Type of data |
|---|---|
| 0 | A file with [mpeg] [mpeg2] [mp4] [jpeg] or [png] extension |
| 1 | A File with an extension different from above [mpeg] [mpeg2] [mp4] [jpeg] or [png] extension |
| 2 | Data stored in memory region used or allocated by OS or application |
F I G. 5
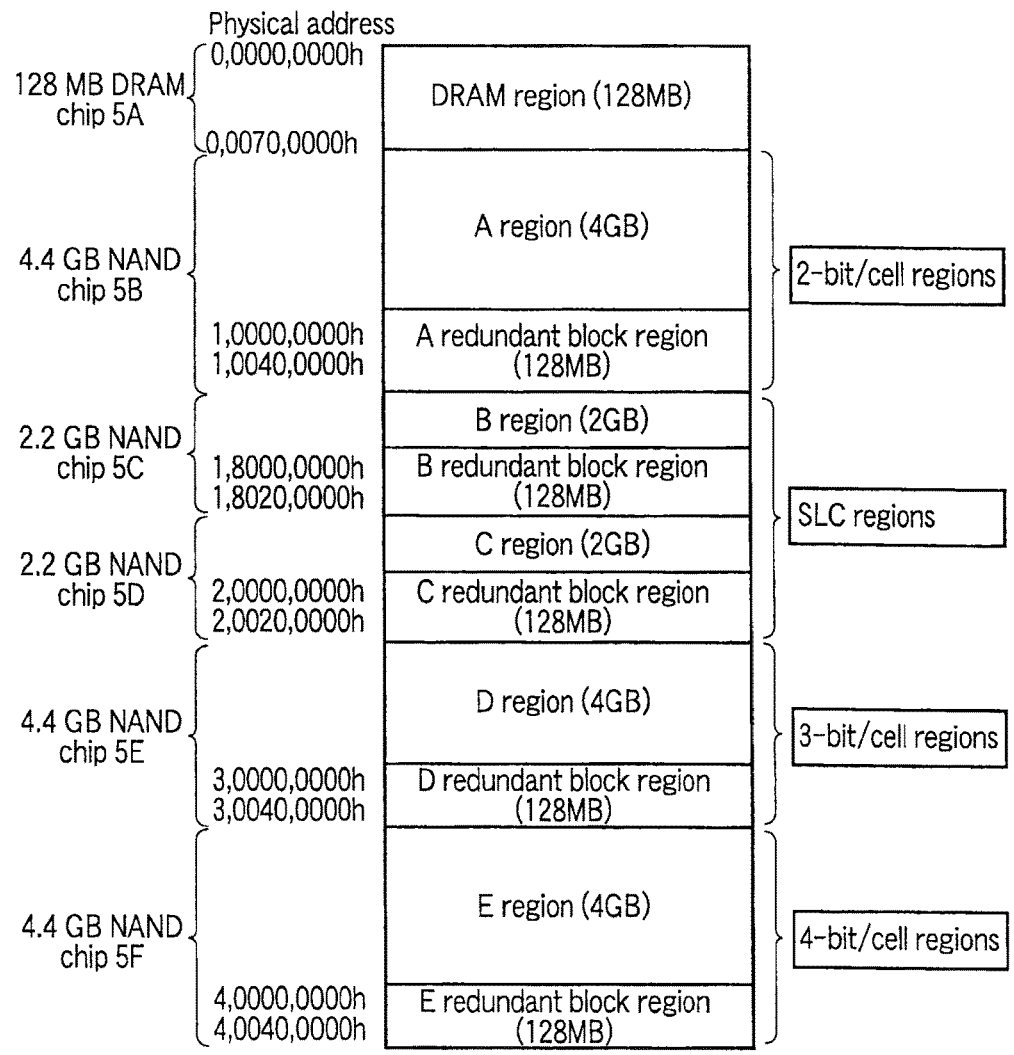
F I G. 6

| Region | Compression determination information | | |
|---|---|---|---|
| | File is already compressed [0] | File is not compressed [1] | Unknown [2] |
| B region | Not compress data | Not compress data | Not compress data |
| A region or C region | Not compress data | Compress data | Not compress data |
| D region | Not compress data | Not compress data | Compress data |
| E region | Not compress data | Compress data | Compress data |

| Data format | Static importance level | Access time interval (month) | | | | | | | | | | |
|---|---|---|---|---|---|---|---|---|---|---|---|---|
| | | 0 | 1 | 2 | 3 | 4 | 5 | 6 | 7 | 8 | 9 | 10 |
| | | 1 | 0.9 | 0.8 | 0.7 | 0.6 | 0.5 | 0.4 | 0.3 | 0.2 | 0.1 | 0 |
| | | Time correction value (T) | | | | | | | | | | |
| | | Dynamic importance level (figures after decimal point are dropped) | | | | | | | | | | |
| Executable file | 9 | 9 | 8 | 7 | 6 | 5 | 4 | 3 | 2 | 1 | 0 | 0 |
| Media file | 4 | 4 | 3 | 3 | 2 | 2 | 2 | 1 | 1 | 0 | 0 | 0 |
| Trash box file | 2 | 2 | 1 | 1 | 1 | 1 | 1 | 0 | 0 | 0 | 0 | 0 |

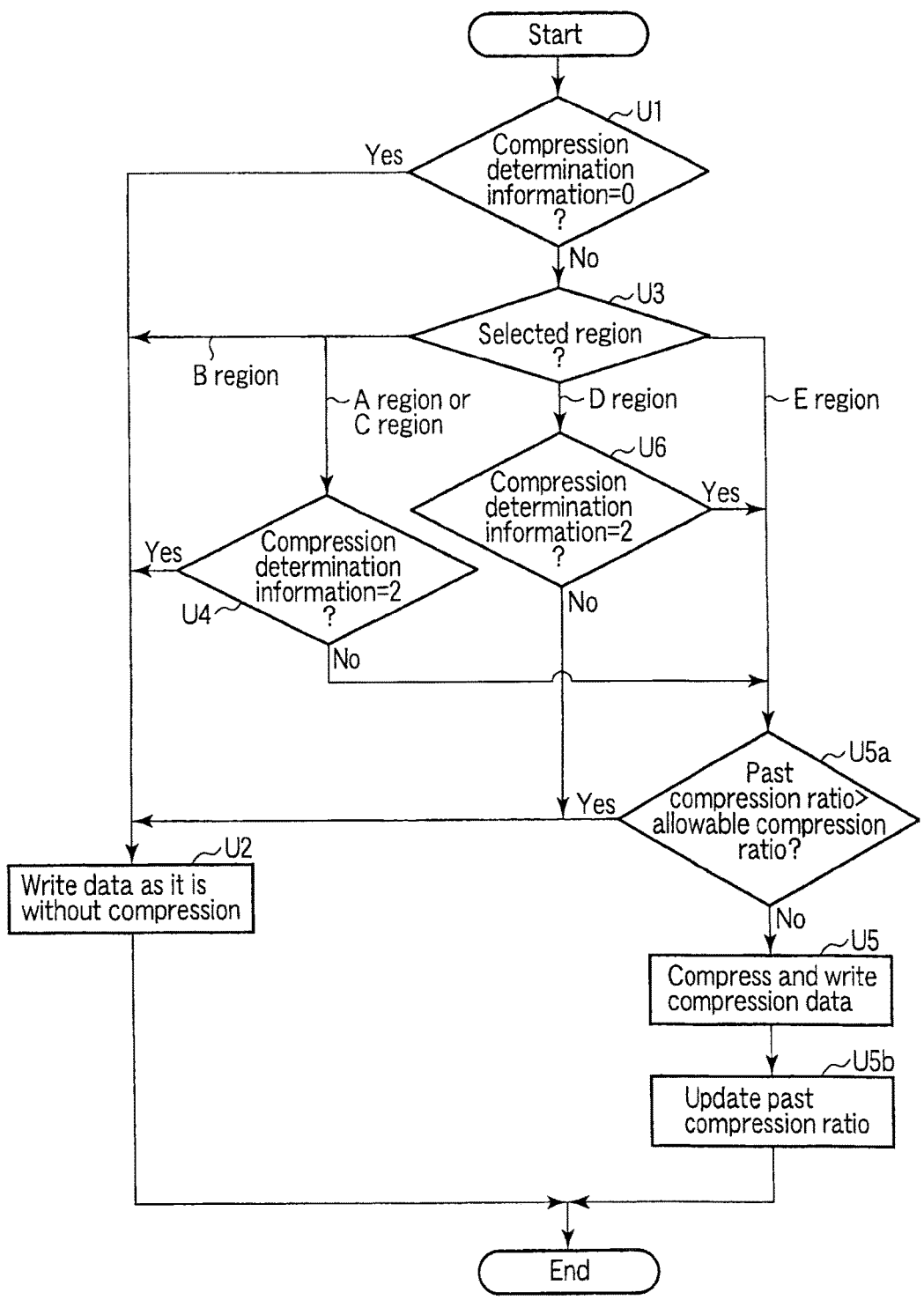
F I G. 14

| Usage rate (%) | | Coloring level | | | | | | | | | |
|---|---|---|---|---|---|---|---|---|---|---|---|
| Volatile memory | SLC | 9 | 8 | 7 | 6 | 5 | 4 | 3 | 2 | 1 | 0 |
| | | Selection of storage used for each coloring level | | | | | | | | | |
| 0 | 0 | Volatile memory | | | | | SLC | | | MCL | |
| 10 | 10 | Volatile memory | | | | | SLC | | | MCL | |
| 20 | 20 | Volatile memory | | | | SLC | | | MCL | | |
| 30 | 30 | Volatile memory | | | SLC | | | MCL | | | |
| 40 | 40 | | | SLC | | | MCL | | | | |
| 50 | 50 | | | SLC | | | MCL | | | | |
| 60 | 60 | | | SLC | | | MCL | | | | |
| 70 | 70 | | | SLC | | | MCL | | | | |
| 80 | 80 | | | SLC | | | MCL | | | | |
| 90 | 90 | | | SLC | | | MCL | | | | |
| 100 | 100 | | | SLC | | | MCL | | | | |

F I G. 16

MEMORY MANAGEMENT DEVICE AND METHOD

CROSS-REFERENCE TO RELATED APPLICATIONS

This application is a continuation of U.S. application Ser. No. 14/506,341 filed Oct. 3, 2014, which is a continuation of U.S. application Ser. No. 12/970,145 filed Dec. 16, 2010, now U.S. Pat. No. 8,880,836, and is based upon and claims the benefit of priority from Japanese Patent Application No. 2009-285423, filed Dec. 16, 2009; the entire contents of each of which are incorporated herein by reference.

FIELD

Embodiments described herein relate generally to a memory management device and method which manage to write or read data or a program for a memory.

BACKGROUND

There are upper limits of the number of writings and readings in a flash memory. Various techniques have heretofore been considered to prolong a lifetime (normality operation time) of the flash memory.

BRIEF DESCRIPTION OF THE DRAWINGS

FIG. 1 is a block diagram an example of a configuration of an information processing device including a memory management device according to a first embodiment;

FIG. 2 is a block diagram showing an example of a program and data handled in the information processing device according to the first embodiment;

FIG. 5 is a block diagram showing an example of a compression determination information according to the first embodiment;

FIG. 6 is a block diagram showing an example of a memory space of a composite memory according to the first embodiment;

FIG. 14 is a flowchart showing an example of compression determination processing and compression processing according to the second embodiment;

FIG. 16 is a graph showing an example of a relation among a coloring level, a memory usage rate and a threshold.

DETAILED DESCRIPTION

Figure 3:
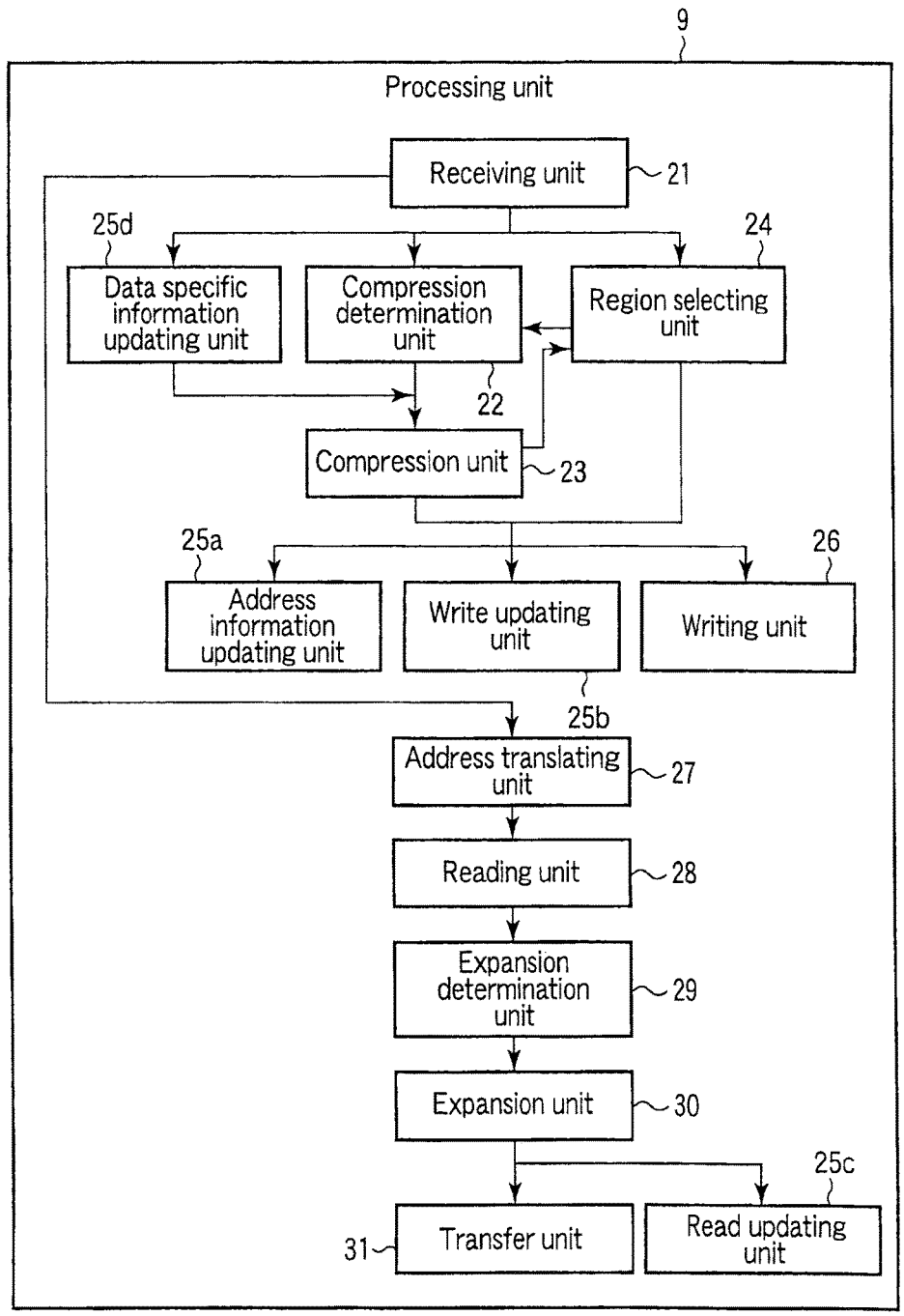
FIG. 3 is a block diagram showing an example of a configuration of a processing unit according to the first embodiment.

In general, according to embodiments, a memory management device includes a receiving unit, a compression determination unit, a compression unit, a region selecting unit, an address information updating unit, a write updating unit, and a writing unit. The receiving unit receives, from a processor, write data or a write program to be written into a nonvolatile memory and a write logical address. The nonvolatile memory has an upper limit of the number of accesses. The compression determination unit determines whether to compress the write data or the write program based on specific information. The specific information includes at least one of the type, number of accesses, access frequency and importance level of the write data or the write program. The compression unit compresses the write data or the write program when the compression determination unit determines to compress the write data or the write program. The region selecting unit selects a write region for the write data or the write program in the nonvolatile memory based on the specific information. The address information updating unit updates address translation information based on information associating a write physical address that indicates the write region selected by the region selecting unit with the write logical address. The write updating unit updates the specific information in response to writing. The writing unit writes compressed write data or a compressed write program into the write region of the nonvolatile memory when the compression determination unit determines to compress the write data or the write program. The writing unit writes uncompressed write data or an uncompressed write program into the write region of the nonvolatile memory when the compression determination unit does not determine to compress the write data or the write program.

Embodiments will be explained below with reference to accompanying drawings. In the drawings, the same reference numbers and symbols denote the same or substantially same elements, and a description thereof will be omitted or briefly described. Only different parts will be explained in detail.

First Embodiment

In the present embodiment, a memory management device for prolonging a lifetime of a semiconductor memory having an upper limit (restriction) of the number of accesses is described.

Here, an access includes at least one of reading and writing. In the present embodiment, the semiconductor memory having an upper limit of the number of writings is mainly described, but there may be present an upper limit of the number of readings or upper limits of both the number of readings and the number of writings.

The semiconductor memory may be a nonvolatile semiconductor memory or a volatile semiconductor memory. As the nonvolatile semiconductor memory, it is possible to use, for example, a NAND-type flash memory, a NOR type flash memory, a phase change memory (PRAM), a resistive random access memory (ReRAM) or a magnetoresistive random access memory (MRAM). As the volatile semiconductor memory, it is possible to use, for example, a dynamic random access memory (DRAM), a fast page mode dynamic random access memory (FPM-DRAM), an extended data out dynamic random access memory (EDO-DRAM) or a synchronous dynamic random access memory (SDRAM).

Data, a program or a combination of data and a program, for example, is written into the semiconductor memory. In the example described according to the present embodiment, data is written.

FIG. 1 is a block diagram showing an example of a configuration of an information processing device including a memory management device according to the present embodiment.

FIG. 2 is a block diagram showing an example of a program and data handled in the information processing device according to the present embodiment.

An information processing device 1 comprises at least one processor (three processors in the example of FIGS. 1) 2a to 2c, a bus 3, a memory management device 4 and a composite memory 5.

The processors 2a to 2c access the composite memory 5 via the bus 3 and the memory management device 4. The processors 2a to 2c comprise primary cache memories 6a to 6c and secondary cache memories 7a to 7c, respectively.

In the present embodiment, when, for example, the composite memory 5 includes a NAND-type flash memory, writing, reading and erasing are performed in the primary cache memories 6a to 6c and the secondary cache memories 7a to 7c by a page size, a size two times the page size or more (a multiple of the page size), a block size, or a size two times the block size or more (a multiple of the block size).

Writing, reading and erasing are also performed in the composite memory 5 by, for example, a page size, a multiple of the page size, a block size, or a multiple of the block size.

For example, the writing sizes, reading sizes and erasing sizes of the primary cache memories 6a to 6c and the secondary cache memories 7a to 7c conform to those of the composite memory 5. In this case, data can be efficiently sent or received between the processors 2a to 2c, the memory management device 4 and the composite memory 5.

In the present embodiment, write data may be compressed. When the write data is compressed, the write data is smaller than a normal data size. In this case, for example, the memory management device 4 combines a plurality of write data to generate composite data having the page size, a multiple of the page size, the block size, or a multiple of the block size. The memory management device 4 writes this composite data into the NAND-type flash memory of the composite memory 5. Generally, in the NAND-type flash memory, the minimum unit of reading or writing is the page size, and the minimum unit of erasing is the block size.

For example, the page size of the NAND-type flash memory of the composite memory 5 is 4 Kbytes. Moreover, three write data are generated for the NAND-type flash memory. The size of the compressed first write data is 3 Kbytes. The size of the compressed second write data is 2 Kbytes. There is no effect of compression on the third write data, or the third write data is not compressed, and the size of the third write data is 4 Kbytes.

In this example, the memory management device 4 writes, into the NAND-type flash memory, 4 Kbytes (3 Kbytes+1 Kbyte) of first composite data which is a combination of the compressed first write data and 1 Kbyte of the compressed second write data.

Furthermore, the memory management device 4 writes, into the NAND-type flash memory, 4 Kbytes (1 Kbyte+3 Kbytes) of second composite data which is a combination of remaining 1 Kbyte of the compressed second write data and 3 Kbytes of the third write data.

Moreover, the memory management device 4 temporarily saves remaining 1 Kbyte of the third write data in a working memory 10 such as a buffer memory so that this data is to be combined with next write data when the next write data is generated. In addition, at a time when constraint writing is indicated (e.g., when flushing data is required or the information processing device 1 is shut down), the memory management device 4 writes, into the NAND-type flash memory, third composite data which is a combination of the remaining 1 Kbyte of the third write data saved in the working memory 10 and 3 Kbytes of dummy data.

The processors 2a to 2c execute processes 8a to 8c, respectively. Virtual logical addresses are used in the processes 8a to 8c.

The composite memory 5 is accessed from the processor 2b in the example described according to the present embodiment, and the same applies to the case where the composite memory 5 is accessed from the other processor 2a or processor 2c.

The memory management device 4 comprises a processing unit 9 such as an MPU, and memory units (e.g., the working memory 10, a first register 11 and a second register 12).

The composite memory 5 comprises a plurality of types of semiconductor memories having different upper limits of the number of accesses. In the present embodiment, the composite memory 5 comprises a volatile semiconductor memory 5a and nonvolatile semiconductor memories 5b and 5c.

The composite memory 5 is used as a main memory of the information processing device 1 in the present embodiment. However, the composite memory 5 may be used for another purpose.

For example, the volatile semiconductor memory 5a is a DRAM, the nonvolatile semiconductor memory 5b is a single-level-cell (SLC) NAND-type flash memory, and the nonvolatile semiconductor memory 5c is a multi-level-cell (MLC) NAND-type flash memory. However, the composite memory 5 may be a combination of other types of semiconductor memories. Instead of the composite memory 5, one type nonvolatile semiconductor memory may be used.

The SLC is capable of faster reading and writing and more reliable than the MLC. However, the SLC is lower in element integration than the MLC and is not suited for higher capacity.

The MLC is slower in reading and writing and less reliable than the SLC. However, the MLC is higher in element integration than the SLC and is suited for higher capacity.

The reliability means the degree of unlikelihood of a data loss in reading data from a memory device.

The SLC is higher in durability than the MLC. Here, higher durability means a higher upper limit of the number of accesses (greater number of times of possible accesses), and lower durability means a lower upper limit of the number of accesses (smaller number of times of possible accesses).

The SLC can store M (an integral number equal to or more than 1) bits of information in one memory cell. The MLC can store M+1 or more bits of information in one memory cell.

That is, in the composite memory 5 according to the present embodiment, the volatile semiconductor memory 5a has higher durability than the nonvolatile semiconductor memory 5b and the nonvolatile semiconductor memory 5c. The nonvolatile semiconductor memory 5b has higher durability than the nonvolatile semiconductor memory 5c. The volatile semiconductor memory 5a, the nonvolatile semiconductor memory 5b and the nonvolatile semiconductor memory 5c rank in descending order of durability.

The nonvolatile semiconductor memories 5b and 5c which are, for example, NAND-type flash memories are less expensive and can have higher capacity than the volatile semiconductor memory 5a.

An operating system 13 is stored in at least one of the nonvolatile semiconductor memories 5b and 5c of the composite memory 5.

This operating system 13 is executed by at least one of the processes 8a to 8c and by the processing unit 9 of the memory management device 4. The processing unit 9 may execute a firmware.

Memory usage information 14, memory specific information 15, an address translation table 16 and a coloring table 17 are stored in at least one of the nonvolatile semiconductor memories 5b and 5c of the composite memory 5. The memory usage information 14, the memory specific information 15, the address translation table 16 and the coloring table 17 are managed and updated by, for example, the operating system 13. The memory usage information 14, the memory specific information 15, the address translation table 16 and the coloring table 17 may otherwise be managed by, for example, the firmware executed by the processing unit 9.

The memory usage information 14 includes information that indicates a usage state for each region, for example, the number or frequency of accesses to each region (e.g., region per page or block unit) of the composite memory 5.

The memory specific information 15 includes specific information set for each region of the composite memory 5, for example, the upper limit of the number of accesses for each region (e.g., per page unit, per block unit or per memory type) of the composite memory 5.

The address translation table 16 includes information which associates logical addresses with physical addresses. This address translation table 16 can be used to translate a logical address received from one of the processors 2a to 2c to a physical address.

The coloring table 17 includes information that indicates the characteristics of the access condition of each data. Each entry of the coloring table 17 includes access specific information for each data.

The access specific information for each data includes a static writing frequency, a static reading frequency, compression determination information (e.g., data compression hint information such as information on a file type corresponding to data), static importance level, a data duration, a data generation time, the number of writings, the number of readings, a dynamic writing frequency, a dynamic reading frequency, a previous access time, dynamic importance level and compression/uncompression information.

The coloring table 17 is referred to when data is written into the composite memory 5 or when data is read from the composite memory 5. The coloring table 17 is used to select a write position corresponding to the contents of the data, to determine whether to compress the data at the time of writing, and to determine whether the read data is compressed state.

In the present embodiment, data 181 to 18n to be written or read have a data structure in which data main portions 191 to 19n are combined with data specific information 201 to 20n including the number of writings, number of readings, writing frequency, reading frequency, writing time and reading time of the data 181 to 18n, respectively.

The data specific information 201 to 20n may be deleted or separated from the data 181 to 18n. In this case, the data specific information 201 to 20n separated from the data 181 to 18n may be managed in the coloring table 17 or may be collectively managed as different data.

For example, the entries of the coloring table 17 are generated on the basis of the data specific information 201 to 20n corresponding to the data 181 to 18n.

The working memory 10 of the memory management device 4 is used as, for example, a buffer or cache memory, and is used as a work area for, for example, converting and temporarily storing various kinds of data.

The processing unit 9 of the memory management device 4 accesses the working memory 10 to perform various processes on the basis of various kinds of information stored in the first register 11, the second register 12 and the composite memory 5.

The processing unit 9 stores, in the first register 11 or the working memory 10, the memory usage information 14, the memory specific information 15 and the address translation table 16 that are stored in the composite memory 5.

The processing unit 9 stores, in the second register 12, an address (e.g., base address) necessary for accessing the coloring table 17 stored in the composite memory 5. Otherwise, the processing unit 9 may store the coloring table 17 in the working memory 10 and access the coloring table 17.

Furthermore, the processing unit 9 accesses the memory usage information 14, the memory specific information 15 and the address translation table 16 that are stored in the first register 11, and also accesses the coloring table 17 referred to by use of the address stored in the second register 12, thereby controlling access to data in the composite memory 5.

When a data updating event occurs, the processing unit 9 updates the memory usage information 14 and the address translation table 16 that are stored in the composite memory 5 in accordance with the contents stored in the first register 11, and if necessary, updates the memory specific information 15. For example, the data updating event includes a passage of a preset updating period or before an operation stop of the information processing device 1.

Alternatively, addresses (e.g., base addresses) necessary to access the memory usage information 14, the memory specific information 15 and the address translation table 16 may be stored in the first register 11. In this case, on the basis of the address stored in the first register 11, the processing unit 9 refers to the memory usage information 14, the memory specific information 15 and the address translation table 16 that are stored in the composite memory 5, thereby controlling access to the composite memory 5.

The coloring table 17 stored in the composite memory 5 may be stored in the second register 12. In this case, the processing unit 9 accesses the coloring table 17 stored in the second register 12 to control access to the composite memory 5. When the data updating event occurs, the processing unit 9 updates, in accordance with the contents stored in the second register 12, the coloring table 17 stored in the composite memory 5.

FIG. 3 is a block diagram showing an example of a configuration of the processing unit 9 according to the present embodiment. FIG. 3 represents the contents and transition of the operation of the processing unit 9.

The processing unit 9 comprises a receiving unit 21, a compression determination unit 22, a compression unit 23, a region selecting unit 24, an address information updating unit 25*a*, a write updating unit 25*b*, a writing unit 26, an address translating unit 27, a reading unit 28, an expansion determination unit 29, an expansion unit 30, a transfer unit 31 and a read updating unit 25*c*.

The write operation by the processing unit 9 is described first. In the following, the write operation for the data 181 will be explained.

The receiving unit 21 of the processing unit 9 receives, from the processor 2*b*, the write data 181 and a logical address for the write data 181, and stores the write data 181 and the logical address in the working memory 10.

The region selecting unit 24 selects a write region for writing the write data 181 out of the composite memory 5 on the basis of the memory usage information 14, the memory specific information 15, information on an entry corresponding to the write data 181 in the coloring table 17, and the data specific information 201 for the write data 181.

For example, in the present embodiment, the region selecting unit 24 first selects one of the memories 5*b* and 5*c* of the composite memory 5 to write the write data 181 on the basis of an access characteristic of the write data 181. The region selecting unit 24 then selects a write region (write position) for the write data 181 out of a region of a selected memory on the basis of, for example, a result of wear-leveling.

The compressed write data 181 stored in the working memory 10 or the uncompressed write data 181 may be combined with other compressed or uncompressed write data. The region selecting unit 24 may then select a write region for composite data of a page size, a multiple of the page size, a block size, or a multiple of the block size.

The compression determination unit 22 determines whether the write data 181 satisfies with a compression permission condition in accordance with, for example, the compression determination information, number of accesses, access frequency and previous access time for the write data 181 that are managed by the coloring table 17 and a region selection result by the region selecting unit 24 (selected memory region or write region).

For example, when the compression determination information for the write data 181 indicates a type of information that permits compression, the compression determination unit 22 determines to compress the write data 181. When the compression determination information for the write data 181 indicates a type of information that does not permit compression, the compression determination unit 22 determines not to compress the write data 181.

For example, when the compression determination information for the write data 181 indicates a type of information that permits compression and when the number of accesses (or the access frequency) is equal to or less than a compression permission threshold, the compression determination unit 22 determines to compress the write data 181. On the contrary, when the compression determination information for the write data 181 indicates a type of information that does not permit compression or when the number of accesses (or the access frequency) is beyond the compression permission threshold, the compression determination unit 22 determines not to compress the write data 181. As a result of this determination, data which corresponds to a type of information that permits compression and which has a small number of accesses or a low access frequency can be only compressed and stored in the composite memory 5.

For example, when the compression determination information for the write data 181 indicates a type of information that permits compression and when the interval between a current time and the previous access time is equal to or more than a compression permission interval, the compression determination unit 22 determines to compress the write data 181. On the contrary, when the compression determination information for the write data 181 indicates a type of information that does not permit compression or when the interval between the current time and the previous access time is less than the compression permission interval, the compression determination unit 22 determines not to compress the write data 181. As a result of this determination, data which corresponds to a type of information that permits compression and which is assumed to have a great interval between the prior access and the next access can be only compressed and stored in the composite memory 5.

For example, the compression determination unit 22 may determine whether to compress the write data 181 in accordance with the type of memory region of the write data 181 selected by the region selecting unit 24.

For example, the compression determination unit 22 may not compress the write data 181 when the SLC nonvolatile semiconductor memory 5*b* is selected as a write region. The compression determination unit 22 may compress the write data 181 when the MLC nonvolatile semiconductor memory 5*c* is selected as a write region. This makes it possible to increase the speed of access to the SLC nonvolatile semiconductor memory 5*b*.

In contrast, the compression determination unit 22 may compress the write data 181 when the SLC nonvolatile semiconductor memory 5*b* is selected as a write region. The compression determination unit 22 may not compress the write data 181 when the MLC nonvolatile semiconductor memory 5*c* is selected as a write region. This makes it possible to increase storage capacity that permits data to be written in the SLC nonvolatile semiconductor memory 5*b*.

A data specific information updating unit 25*d* updates the number of writings, the writing frequency and the previous access time in the data specific information 201 for the write data 181 in response to writing (when data is written).

In response to a result of the determination by the compression determination unit 22, when the compression determination unit 22 determines to compress the write data 181, the compression unit 23 compresses the write data 181 in the working memory 10, and stores the compressed write data 181 in the working memory 10.

The address information updating unit 25*a* updates the address translation table 16 by use of information associating the logical address for the write data 181 stored in the working memory 10 with a physical address that indicates the write region for the write data 181.

In response to writing, the write updating unit 25*b* updates information on the write region for the write data 181 within the memory usage information 14, and the number of writings, writing frequency and previous write time in entry information corresponding to the write data 181 within the coloring table 17.

For example, the write updating unit 25*b* may register the compression/uncompression information (flag) for determining whether the write data 181 has been compressed, in an entry corresponding to the write data 181 within the coloring table 17.

The writing unit 26 stores, in the selected write region within the composite memory 5, the compressed write data 181 or the uncompressed write data 181 stored in the working memory 10. In addition, the writing unit 26 may combine the compressed write data 181 or the uncompressed write data 181 stored in the working memory 10 with other compressed or uncompressed write data and write, into the composite memory 5, the combined composite data of a page size, a multiple of the page size, a block size, or a multiple of the block size.

Now, a read operation by the processing unit 9 is described. In the following, the read operation for the data 181 will be explained.

The receiving unit 21 receives, from the processor 2b, the logical address and stores it in the working memory 10.

Using the address translation table 16, the address translating unit 27 translates the logical address stored in the working memory 10 into a physical address, and stores the physical address into the working memory 10.

The reading unit 28 reads the compressed read data 181 or reads the uncompressed read data 181 stored in the region indicated by the physical address stored in the working memory 10, and stores the read data into the working memory 10.

On the basis of information (e.g., compression/uncompression information) for an entry corresponding to the read data 181 in the coloring table 17, the expansion determination unit 29 determines whether the read data 181 read from the composite memory 5 and stored in the working memory 10 is compressed.

When it is determined that the read data 181 stored in the working memory 10 is compressed, the expansion unit 30 expands (decompresses/extracts) the compressed read data 181, and stores the expanded read data 181 into the working memory 10.

In response to reading, the read updating unit 25c updates information on a memory region for the read data 181 within the memory usage information 14, the number of readings, reading frequency and previous read time in entry information corresponding to the read data 181 within the coloring table 17, and the number of readings, reading frequency and previous read time in the data specific information 201.

The transfer unit 31 sends the uncompressed read data 181 stored in the working memory 10 to the processor 2b.

Figure 4:
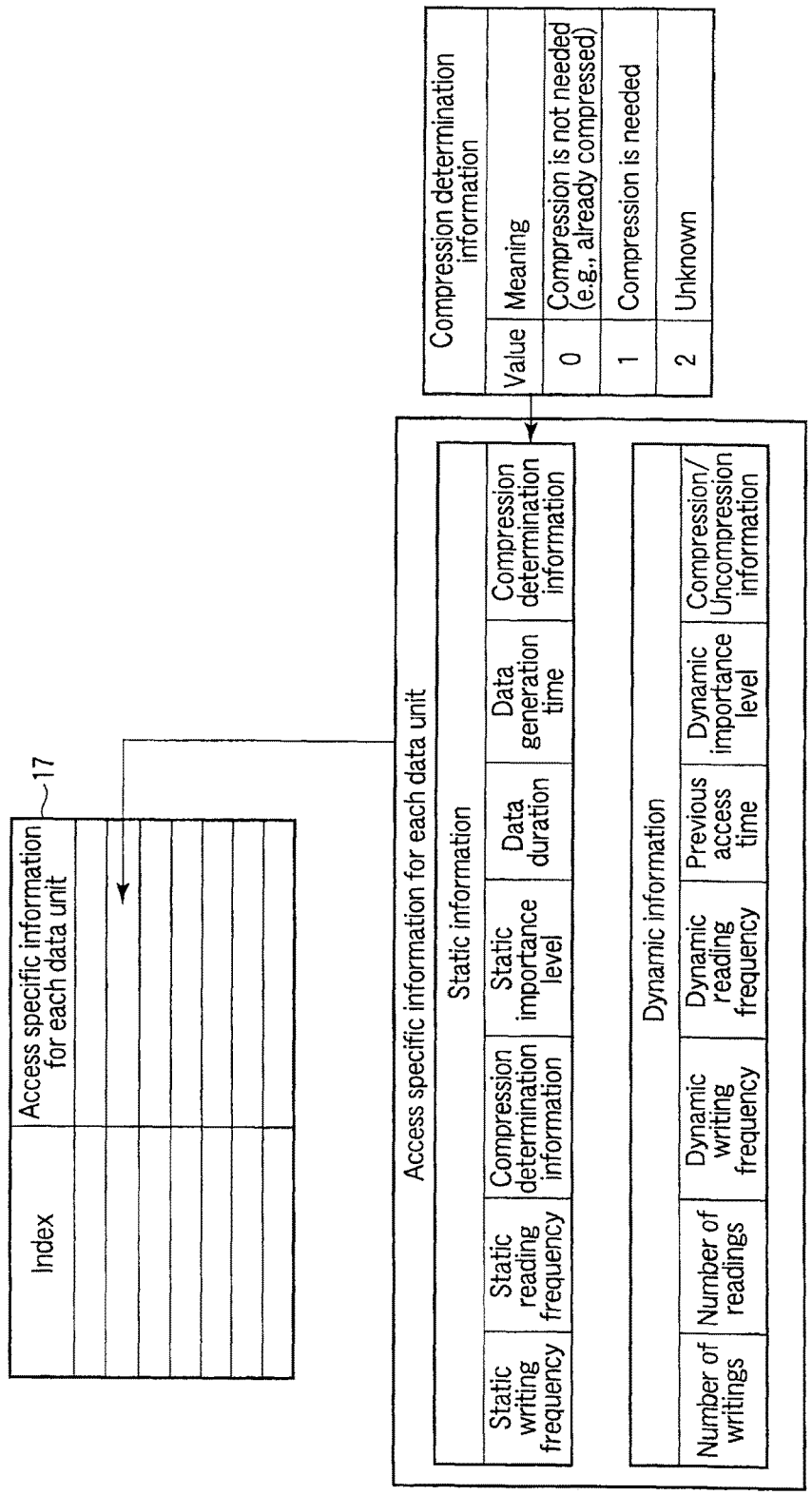
FIG. 4 is a block diagram showing an example of a format of a coloring table according to the first embodiment.

FIG. 4 is a block diagram showing an example of a format of the coloring table 17 according to the present embodiment.

Each entry of the coloring table 17 is allocated to the minimum IO unit of data (data size for reading and writing). For example, the data size for reading and writing is the page size of the NAND-type flash memory. For example, each entry of the coloring table 17 may correspond to data having a page size of the operating system 13 or data having a multiple of the page size of the operating system 13.

Each entry of the coloring table 17 includes access specific information for each data.

The access specific information includes static information and dynamic information. The static information is access information fixedly set for corresponding data. The dynamic information is access information that varies depending on an access state to the corresponding data.

In the present embodiment, the writing frequency is a value indicating the amount of writing, and may be statically set in accordance with the type of data or may be dynamic information obtained from the number of writings and time information. For example, the writing frequency is the number of writings per unit time or a change in the number of writings with time progress.

In the present embodiment, the reading frequency is a value indicating the amount of reading, and may be statically set in accordance with the type of data or may be dynamic information obtained from the number of readings and time information. For example, the reading frequency is the number of readings per unit time or a change in the number of readings with time progress.

That is, the static writing frequency, the static reading frequency and the static importance level are writing frequency, reading frequency and importance level estimated from corresponding data, respectively. For example, the static writing frequency, the static reading frequency and the static importance level are generated from the type of corresponding data in accordance with a rule that is set by a user or preset.

The data duration is a valid period of corresponding data. The data generation time is the generation time of corresponding data.

The compression determination information is information for, when corresponding data is stored in the composite memory 5, determining whether the corresponding data needs to be compressed.

The number of writings means the number of times of writing the corresponding data.

The number of readings means the number of times of reading the corresponding data.

The dynamic writing frequency is a value of, for example, the number of writings per unit time or a change rate of the number of writings generated on the basis of the number of times of writing the corresponding data, the data generation time and the current time.

The dynamic reading frequency is a value of, for example, the number of readings per unit time or a change rate of the number of readings generated on the basis of the number of times of reading the corresponding data, the data generation time and the current time.

The dynamic importance level is a value that represents the importance level of the corresponding data that changes with time. For example, importance level is lower when the interval of accesses is greater.

The compression/uncompression information (flag) that indicates whether the write data 181 has been compressed may be set in the dynamic information. For example, this compression/uncompression information is used for expansion determination processing by the expansion determination unit 29 when written data is read.

FIG. 5 is a block diagram showing an example of the compression determination information according to the present embodiment.

Compression determination information "0" means that corresponding data does not need to be compressed. For example, when the extension of a file that includes the corresponding data is "mpeg", "mpeg2", "mp3", "mp4", "jpeg" or "png" indicating compressed data, the corresponding data has already been compressed and does not need to be compressed again. Thus, the compression determination information "0" is set.

Compression determination information "1" means that corresponding data does not need to be compressed. For example, when the file that includes the corresponding data is not a compressed file or when the extension of the file that includes the corresponding data is "c", "txt", "html" or "log"

indicating that data compression is effective, the compression determination information "1" is set.

Compression determination information "2" means that it is not known whether corresponding data needs to be compressed. For example, when the corresponding data is stored in an in-kernel used region of the operating system 13, in a region required for process generation or in a region dynamically required by the process, the compression determination information "2" is set.

The relation between data and files is managed by the operating system 13.

FIG. 6 is a block diagram showing an example of a memory space of the composite memory 5 according to the present embodiment.

A physical address is allocated to each region of the composite memory 5.

The composite memory 5 comprises a chip 5A which is a DRAM, and chips 5B to 5F which are NAND-type flash memories.

The memory space of the composite memory 5 includes a DRAM region of the chip 5A, an A region and A redundant block region of the chip 5B, a B region and B redundant block region of the chip 5C, a C region and C redundant block region of the chip 5D, a D region and D redundant block region of the chip 5E, and an E region and E redundant block region of the chip 5F.

The A region and the A redundant block region are 2-bit/cell MLC regions. The B region, the B redundant block region, the C region and the C redundant block region are SLC regions. The D region and the D redundant block region are 3-bit/cell MLC regions. The E region and the E redundant block region are 4-bit/cell MLC regions.

In the present embodiment, the A redundant block region, the B redundant block region, the C redundant block region, the D redundant block region and the E redundant block region are used, for example, to collectively reallocate data in use in the case of garbage collection in the A region, the B region, the C region, the D region and the E region, respectively.

Figure 7:
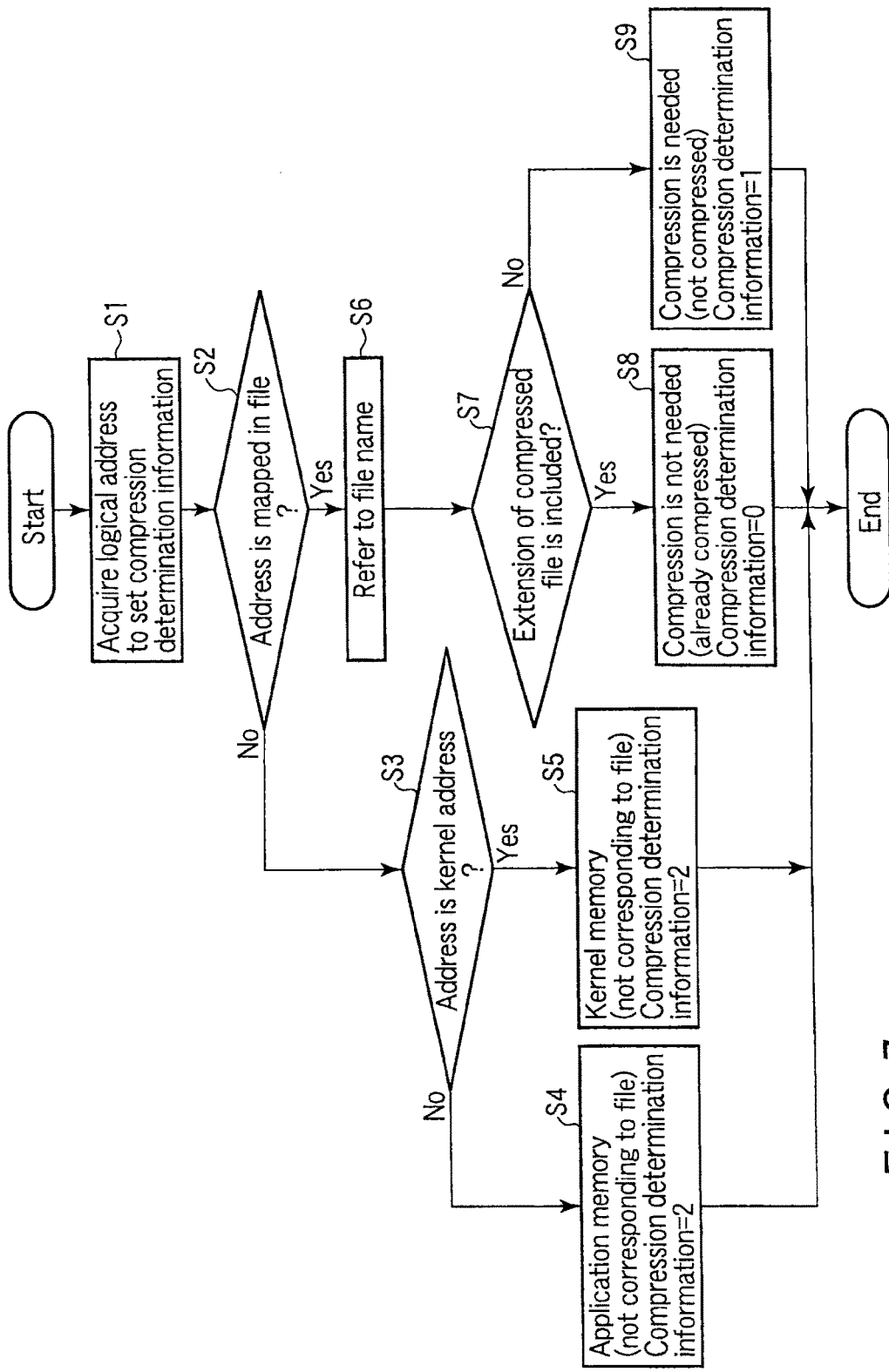
FIG. 7 is a flowchart showing compression determination information setting processing executed by an operating system according to the first embodiment.

FIG. 7 is a flowchart showing compression determination information setting processing executed by the operating system 13 according to the present embodiment.

FIG. 7 shows, by way of example, a case where the compression determination information is set in accordance with whether a logical address is associated with a file and whether a file corresponding to a logical address has been compressed.

In step S1, the operating system 13 acquires a logical address for which the compression determination information is to be set.

In step S2, the operating system 13 determines whether the acquired logical address is mapped in a file (whether the acquired logical address corresponds to the file).

When the logical address is not mapped in the file, the operating system 13 determines in step S3 whether the logical address is a kernel address.

When the logical address is not a kernel address, the logical address is an application address indicating an application memory and is an address that does not correspond to the file, so that the operating system 13 sets "2" for the compression determination information in the coloring table 17 in step S4.

When the logical address is a kernel address, the logical address is a kernel address indicating a kernel memory and is an address that does not correspond to the file, so that the operating system 13 sets "2" for the compression determination information in the coloring table 17 in step S5.

When the logical address is mapped in the file, the operating system 13 acquires identification information (name or extension) for a file corresponding to the logical address in step S6.

In step S7, the operating system 13 determines whether the identification information for the file corresponding to the logical address includes the extension of a compressed file.

When the identification information for the file corresponding to the logical address includes the extension of the compressed file, the file corresponding to the logical address has already been compressed and does not need to be further compressed, so that the operating system 13 sets "0" for the compression determination information in step S8.

When the identification information for the file corresponding to the logical address does not include the extension of the compressed file, the file corresponding to the logical address is not compressed and needs to be compressed, so that the operating system 13 sets "1" for the compression determination information in step S9.

Figure 8:
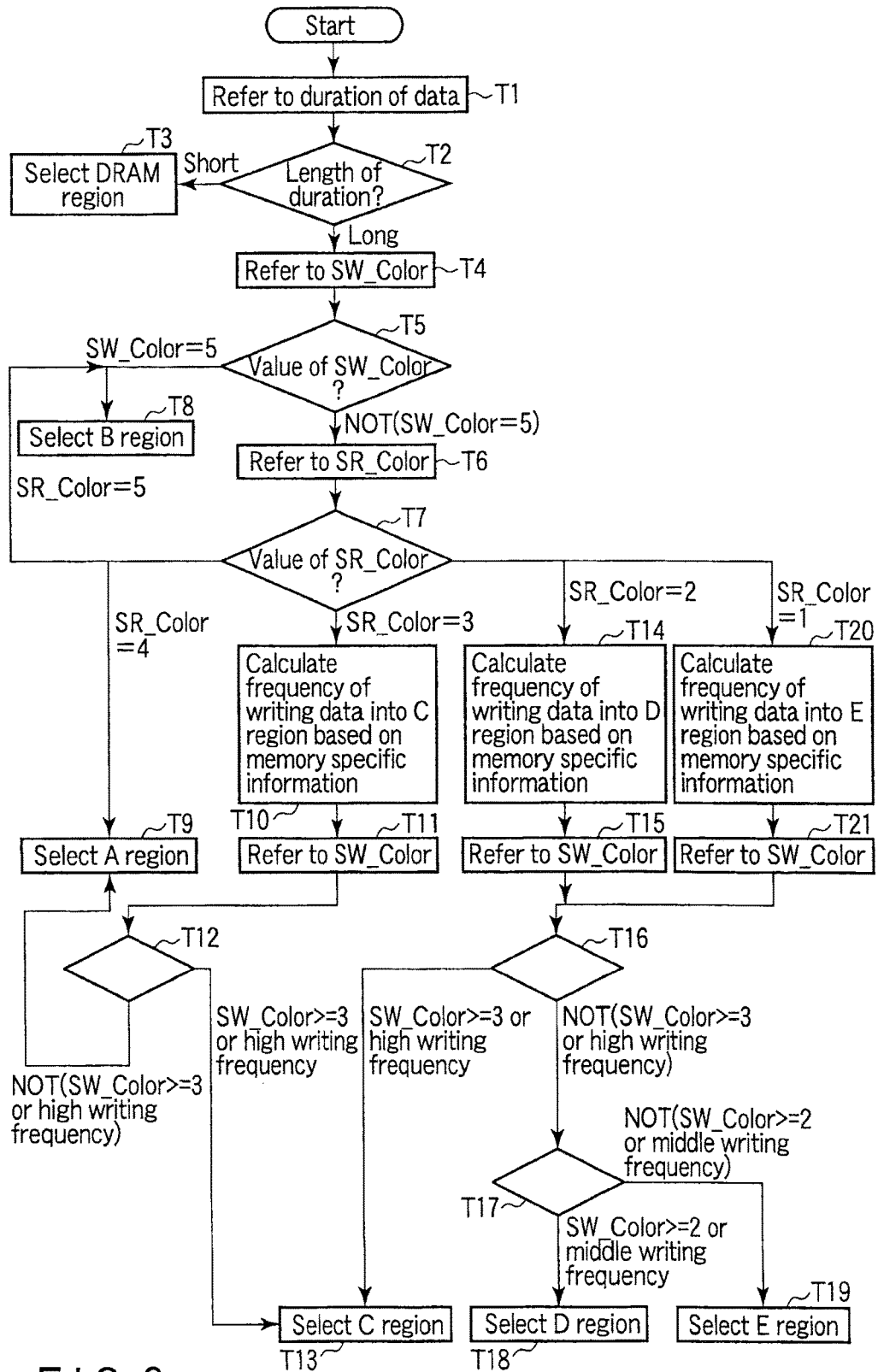
FIG. 8 is a flowchart showing an example of writing region selecting processing by a region selecting unit according to the first embodiment.

FIG. 8 is a flowchart showing an example of memory region selecting processing by the region selecting unit 24 according to the present embodiment.

In FIG. 8, SW_Color indicates the writing frequency of the write data 181. When SW_Color has a greater numerical value, the writing frequency of the write data 181 is higher. For example, SW_Color is indicated by values 1 to 5.

SR_Color indicates the reading frequency of the write data 181. When SR_Color has a greater numerical value, the reading frequency of the write data 181 is higher. For example, SR_Color is indicated by values 1 to 5.

Moreover, FIG. 8 shows, by way of example, a case where a memory region for writing the write data 181 is selected from the DRAM region and the A region to the E region of the composite memory 5 having the above-described configuration shown in FIG. 6.

In step T1, the region selecting unit 24 refers to the duration of the write data 181 managed by the coloring table 17.

In step T2, the region selecting unit 24 determines whether the duration is more or less than a predetermined value.

When the duration is less than the predetermined value, the region selecting unit 24 selects the DRAM region as a writing destination of the write data 181 in step T3.

When the duration is more than the predetermined value, the region selecting unit 24 refers to SW_Color of the write data 181 managed by the coloring table 17 in step T4.

In step T5, the region selecting unit 24 determines whether 5 is set for SW_Color (whether the writing frequency of the write data 181 is high).

When 5 is set for SW_Color, the process moves to T8, and the B region is selected as the writing destination of the write data 181.

When a value which is not 5 is set for SW_Color, the region selecting unit 24 refers to SR_Color of the write data 181 managed by the coloring table 17 in step T6.

In step T7, the region selecting unit 24 checks which of 1 to 5 is set for SR_Color.

When 5 is set for SR_Color in step T7, the region selecting unit 24 selects the B region as a writing destination of the write data 181 in step T8.

When 4 is set for SR_Color in step T7, the region selecting unit 24 selects the A region as a writing destination of the write data 181 in step T9.

When 3 is set for SR_Color in step T7, the region selecting unit 24 calculates a data writing frequency for the C region from the memory specific information 15 in step T10.

In step T11, the region selecting unit 24 refers to SW_Color of the write data 181 managed by the coloring table 17.

In step T12, the region selecting unit 24 determines whether the condition that "SW_Color is equal to or more than 3 or the writing frequency for the C region is at a high level" is fulfilled.

When the condition that "SW_Color is equal to or more than 3 or the writing frequency for the C region is at a high level" is not fulfilled in step T12, the process moves to T9, and the region selecting unit 24 selects the A region.

When the condition that "SW_Color is equal to or more than 3 or the writing frequency for the C region is at a high level" is fulfilled in step T12, the process moves to T13, and the region selecting unit 24 selects the C region.

When 2 is set for SW_Color in step T7, the region selecting unit 24 calculates a data writing frequency for the D region from the memory specific information 15 in step T14.

In step T15, the region selecting unit 24 refers to SW_Color of the write data 181 managed by the coloring table 17.

In step T16, the region selecting unit 24 determines whether the condition that "SW_Color is equal to or more than 3 or the calculated writing frequency of the region is at a high level" is fulfilled.

When the condition that "SW_Color is equal to or more than 3 or the calculated writing frequency of the region is at a high level" is fulfilled in step T16, the process moves to T13, and the region selecting unit 24 selects the C region.

When the condition that "SW_Color is equal to or more than 3 or the calculated writing frequency of the region is at a high level" is not fulfilled in step T16, the process moves to T17.

In step T17, the region selecting unit 24 determines whether the condition that "SW_Color is equal to or more than 2 or the calculated writing frequency of the region is at a middle level" is fulfilled.

When the condition that "SW_ Color is equal to or more than 2 or the calculated writing frequency of the region is at a middle level" is fulfilled in step T17, the process moves to T18, and the region selecting unit 24 selects the D region.

When the condition that "SW_Color is equal to or more than 2 or the calculated writing frequency of the region is at a middle level" is not fulfilled in step T17, the process moves to T19, and the region selecting unit 24 selects the E region.

When 1 is set for SR_Color in step T7, the region selecting unit 24 calculates a data writing frequency for the E region from the memory specific information 15 in step T20.

In step T21, the region selecting unit 24 refers to SW_Color of the write data 181 managed by the coloring table 17. The process then moves to T16.

Figures 9, 11:
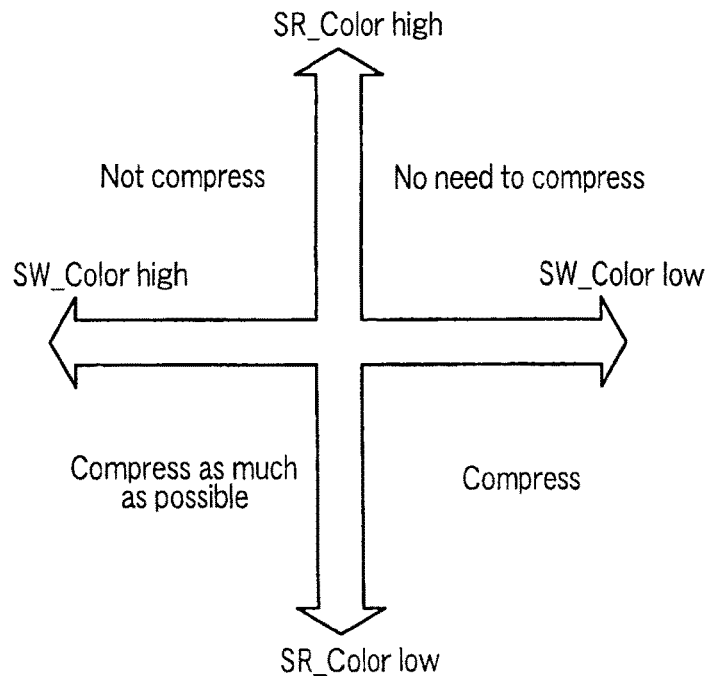
FIG. 9 is a diagram showing an example of an outline of compression determination by a compression determination unit according to the first embodiment.
FIG. 11 is a table showing an example of a relation among a result of memory region selection by the region selecting unit, setting of the compression determination information, and a result of determination by the compression determination unit regarding write data.

FIG. 9 is a diagram showing an example of the outline of compression determination by the compression determination unit 22 according to the present embodiment.

When SW_ Color is high and SR_ Color is high, the compression determination unit 22 does not compress the write data 181.

When SW_Color is high and SR_Color is low, the compression determination unit 22 compresses the write data 181 as much as possible.

When SW_Color is low and SR_Color is high, the compression determination unit 22 does not have to compress the write data 181.

When SW_Color is low and SR_Color is low, the compression determination unit 22 compresses the write data 181.

Figure 10:
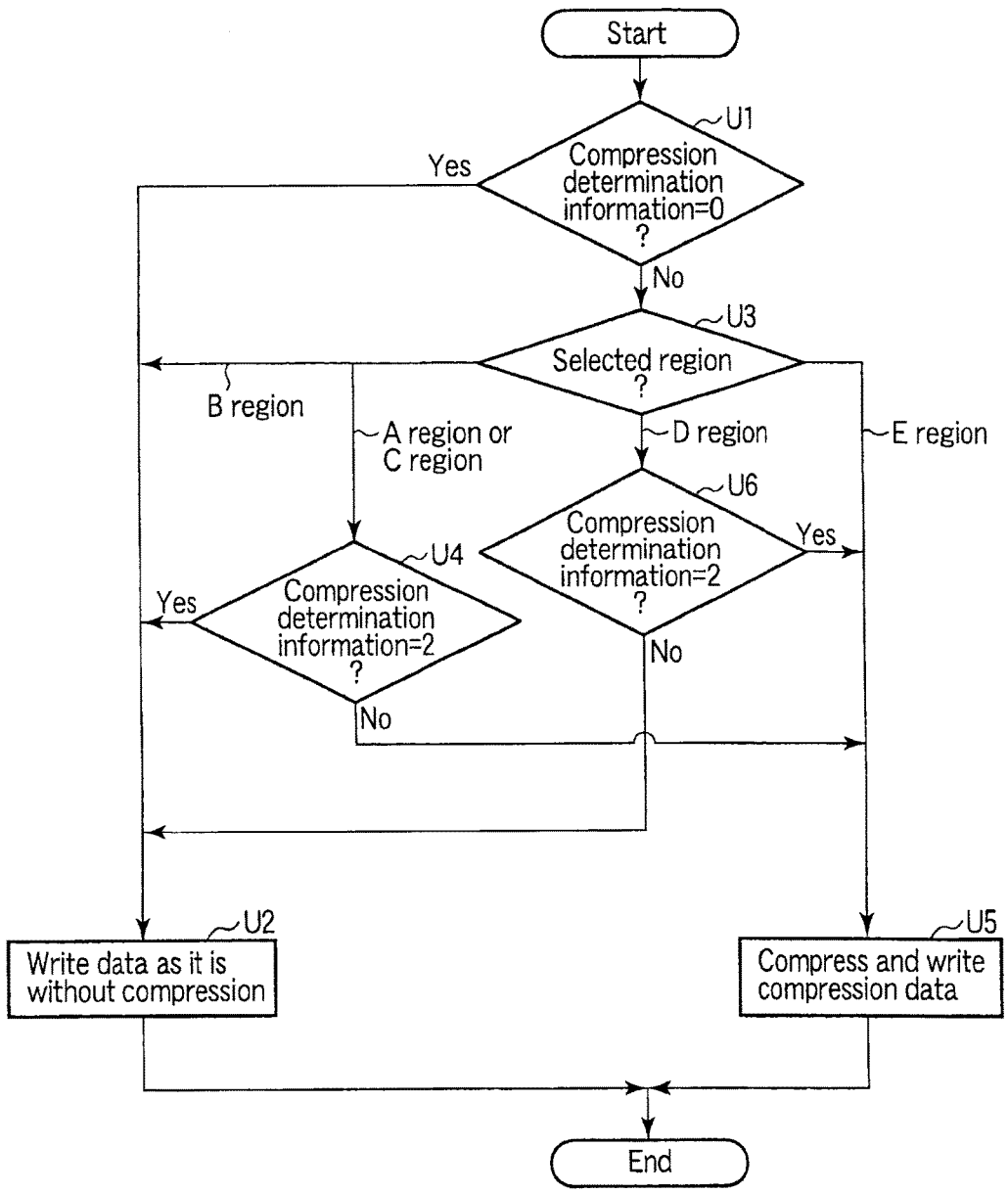
FIG. 10 is a flowchart showing an example of compression determination processing by the compression determination unit and compression processing by a compression unit according to the first embodiment.

FIG. 10 is a flowchart showing an example of compression determination processing by the compression determination unit 22 and compression processing by the compression unit 23 according to the present embodiment.

In the example shown in FIG. 10, whether to compress the write data 181 is determined by whether the file corresponding to the write data 181 is a compressed file and by the memory region which is the writing destination of the write data 181.

FIG. 11 is a table showing an example of the relation among the result of memory region selection by the region selecting unit 24, setting of the compression determination information, and the result of determination by the compression determination unit 22 regarding the write data 181.

In step U1, the compression determination unit 22 determines whether the compression determination information is "0" (whether the data has already been compressed).

When the compression determination information is "0", the compression determination unit 22 does not compress the write data 181 and writes the write data 181 as it is in step U2.

When the compression determination information is not "0", the compression determination unit 22 checks, in step U3, the memory region selected by the region selecting unit 24.

When the B region is selected in step U3, the process moves to step U2. As a result, the write data 181 is written into the B region without being compressed.

When the A region or C region is selected in step U3, the region selecting unit 24 determines in step U4 whether the compression determination information is "2" (whether it is unknown that the data is compressed).

When the compression determination information is "2" in step U4, the process moves to step U2. As a result, the write data 181 is written into the A region or C region without being compressed.

When the compression determination information is not "2" in step U4, the compression determination unit 22 compresses and writes the write data 181 in step U5.

When the D region is selected in step U3, the region selecting unit 24 determines in step U6 whether the compression determination information is "2" (whether it is unknown that the data is compressed).

When the compression determination information is not "2" in step U6, the process moves to step U2. As a result, the write data 181 is written into the D region without being compressed.

When the compression determination information is "2" in step U6, the process moves to step U5, and the compression determination unit 22 compresses and writes the write data 181.

When the E region is selected in step U3, the process moves to step U5. As a result, the write data 181 is compressed and written into the E region.

In the present embodiment, the compression determination information is included in the static information in the access specific information corresponding to the write data 181.

As other information in the dynamic information, the compression determination information is set by the operating system 13. For example, in accordance with the processing shown in FIG. 7, the operating system 13 recognizes the file corresponding to the write data 181 and recognizes whether this file has already been compressed. If the file has already been compressed, the operating system 13 determines that the write data 181 corresponding to this file does not need to be compressed, and sets "0" for the compression determination information.

When there is a request to write data, the region selecting unit 24 selects one of the memory regions in the composite memory 5 shown in FIG. 6, for example, in accordance with the processing shown in FIG. 8.

Furthermore, as shown in FIG. 10, the compression determination unit 22 determines whether to compress the write data 181. In accordance with this determination regarding compression, the compression unit 23 compresses or does not compress the write data 181.

That is, in the present embodiment, the compression determination information is referred to after a data writing region is selected. When the compression determination information is 0, the file corresponding to the write data 181 is already compressed, so that no compression processing is performed for the write data 181, and the write data 181 is stored in the composite memory 5 as it is. When the compression determination information is not 0, whether to compress the write data 181 in accordance with the selected memory region is determined.

When the B region which is an SLC region is selected as a writing destination, both the writing frequency and reading frequency of the write data 181 are high, and increasing the speed of processing is important. Therefore, the write data 181 is not compressed and is stored as it is in any part of the B region.

When the A region or C region is selected as a writing destination, the compression determination information for the write data 181 is referred to. When the writing destination is the A region or C region and the compression determination information is 2, the write data 181 is not compressed and is stored as it is in any part of the A region or C region. When the writing destination is the A region or C region and the compression determination information is not 2, the write data 181 is compressed and stored in any part of the A region or C region.

When the D is selected as a writing destination, the compression determination information for the write data 181 is referred to. When the writing destination is the D region and the compression determination information is not 2, the write data 181 is not compressed and is stored as it is in any part of the D region. When the writing destination is the D region and the compression determination information is 2, the write data 181 is compressed and stored in any part of the D region.

When the E region is selected as a writing destination, both the writing frequency and reading frequency of the write data 181 are low, and the reduction of the data size is important. Therefore, the write data 181 is compressed and is stored in any part of the E region.

In the present embodiment, in order to prolong the lives of the nonvolatile semiconductor memories 5b and 5c which are limited in the number of writings, the write data 181 is compressed as needed, so that the size of the data 181 actually written into the nonvolatile semiconductor memories 5b and 5c is reduced.

The memory management device 4 according to the present embodiment manages the access specific information corresponding to the data to be processed by the processing unit 9. The memory management device 4 translates the virtual logical addresses used in the processes 8a to 8c into the physical addresses. The memory management device 4 further performs the wear leveling on the basis of the access specific information corresponding to the data, the memory usage information 14 and the memory specific information 15. The memory management device 4 also compresses the write data and expands the read data.

The memory management device 4 also compresses the write data and expands the read data.

For example, in UBIFS of Linux®, a compression scheme (e.g., LZO or ZLIB) can be selected.

In UBIFS of Linux, if the whole file system is targeted for compression, data that is already compressed may be again compressed. When data that is already compressed is again compressed in this way, the size of the data may be rather increased. Such unnecessary compression is not appropriate.

In UBIFS of Linux, an individual file can be targeted for compression. However, it requires the user a great deal of effort to determine whether to target each individual file for compression.

According to conventional techniques, when a nonvolatile semiconductor memory is used as a main memory or when a nonvolatile semiconductor memory is used as a swap destination, it is difficult to determine which data to compress and which data to not compress.

According to the present embodiment, to address such a problem, the memory management device 4 automatically determines whether or not to compress per write data. Thus, it is possible to prevent the increase of the data size due to unnecessary compression and also prevent the increase of the effort to be made by the user.

The memory management device 4 according to the present embodiment first receives, from the processor, write data or a write program to be written into the nonvolatile semiconductor memory limited in the number of accesses, and a write logical address.

The memory management device 4 then determines whether to compress the write data or the write program, in accordance with specific information whereby at least one of the type, number of accesses, access frequency and importance level of the write data or the write program is managed.

When it is determined to compress the write data or the write program, the memory management device 4 compresses the write data or the write program.

In accordance with the specific information, the memory management device 4 then selects a write region for the write data or write program to be written into the nonvolatile semiconductor memory.

The memory management device 4 then updates address translation information on the basis of information associating the write physical address that indicates the write region with the write logical address. The memory management device 4 also updates the specific information in response to writing. Moreover, when it is determined to compress the write data or the write program, the memory management device 4 writes the compressed write data or write program into the selected region. When it is not determined to compress the write data or the write program, the memory management device 4 writes the uncompressed write data or write program into the write region.

The memory management device 4 receives a read logical address from the processor.

The memory management device 4 then translates the read logical address into a read physical address in accordance with the address translation information, and reads read data or a read program stored in a read region indicated by the read physical address.

The memory management device 4 then determines whether to expand the read data or the read program in accordance with the specific information.

When it is determined to expand the read data or the read program, the memory management device 4 then expands the read data or the read program. The memory management device 4 also updates the specific information in response to writing. Moreover, when it is determined to expand the read data or the read program, the memory management device 4 transfers the expanded read data or read program to the processor. When it is not determined to expand the read data or the read program, the memory management device 4 transfers, to the processor, the read data or the read program read from the nonvolatile semiconductor memory.

As described above, according to the present embodiment, a writing destination region is selected on the basis of the coloring table 17. Moreover, whether to compress the write data 181 is determined on the basis of the compression determination information. When it is determined to compress the write data 181, the write data 181 is compressed. Consequently, it is possible to maintain a proper access speed and at the same time reduce the size of the write data to be written into the composite memory 5, so that the lifetime of the composite memory 5 can be prolonged.

Figures 12, 15:
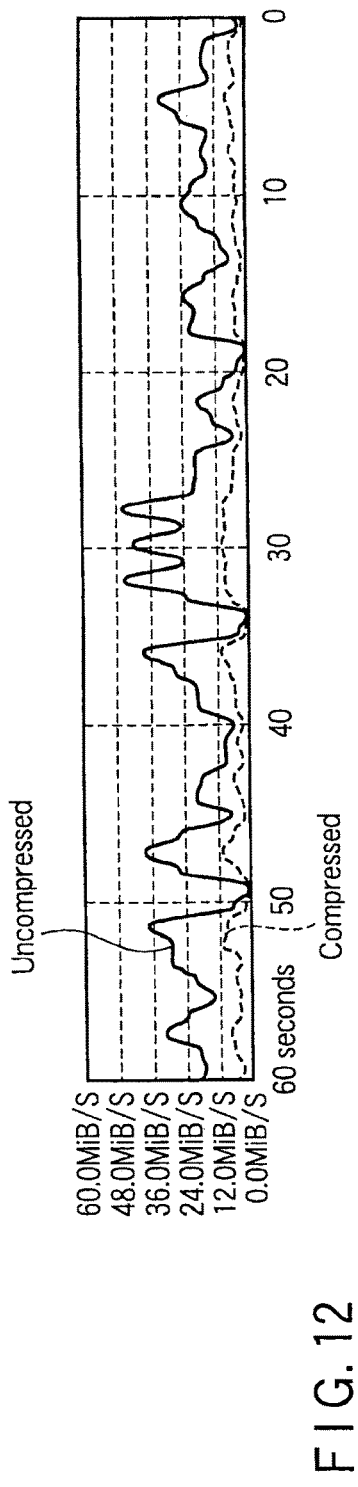
FIG. 12 is a graph showing a comparison result of recording capacities of a memory device with and without data compression.
FIG. 15 is a graph showing an example of calculating a dynamic importance level.

FIG. 12 is a graph showing the comparison of recording capacities of the storage with and without data compression.

As shown, when data is compressed, necessary storage capacity can be smaller than when data is not compressed. Thus, the amount of writing can be reduced, and the lifetime of the storage can be prolonged.

In the present embodiment, whether to compress data can be determined not by a file unit but by a write data unit (e.g., page unit or block unit), and the compression processing can be controlled by a unit smaller than a file.

In the present embodiment, when the extension of the corresponding file of the data is "c", "txt" or "html", it is determined to compress this data. However, the files to be compressed are not exclusively "c", "txt" and "html", and may be files having other extensions.

For example, in Linux, a system running information is recorded incrementally in a file having an extension "log". Some text file creating software periodically creates backup files having an extension "bak".

Such a log file or backup file is higher in writing frequency but lower in reading frequency and tends to be higher in compression ratio than an image file having an extension "mpeg" or "jpg".

Thus, for example, for a log file or backup file, the memory management device 4 sets the compression determination information to 1 to require compression. For a compressed image file, the memory management device 4 sets the compression determination information to 0 to require no compression. As a result, the size of data to be written into the nonvolatile semiconductor memory 5b or 5c of the composite memory 5 can be efficiently reduced.

Second Embodiment

This embodiment is a modification of the first embodiment described above. The memory management device 4 described in the present embodiment determines whether to compress the write data 181 on the basis of at least one of a past (e.g., previous or average) compression ratio and a past compression time (or compression speed) of the write data.

Figure 13:
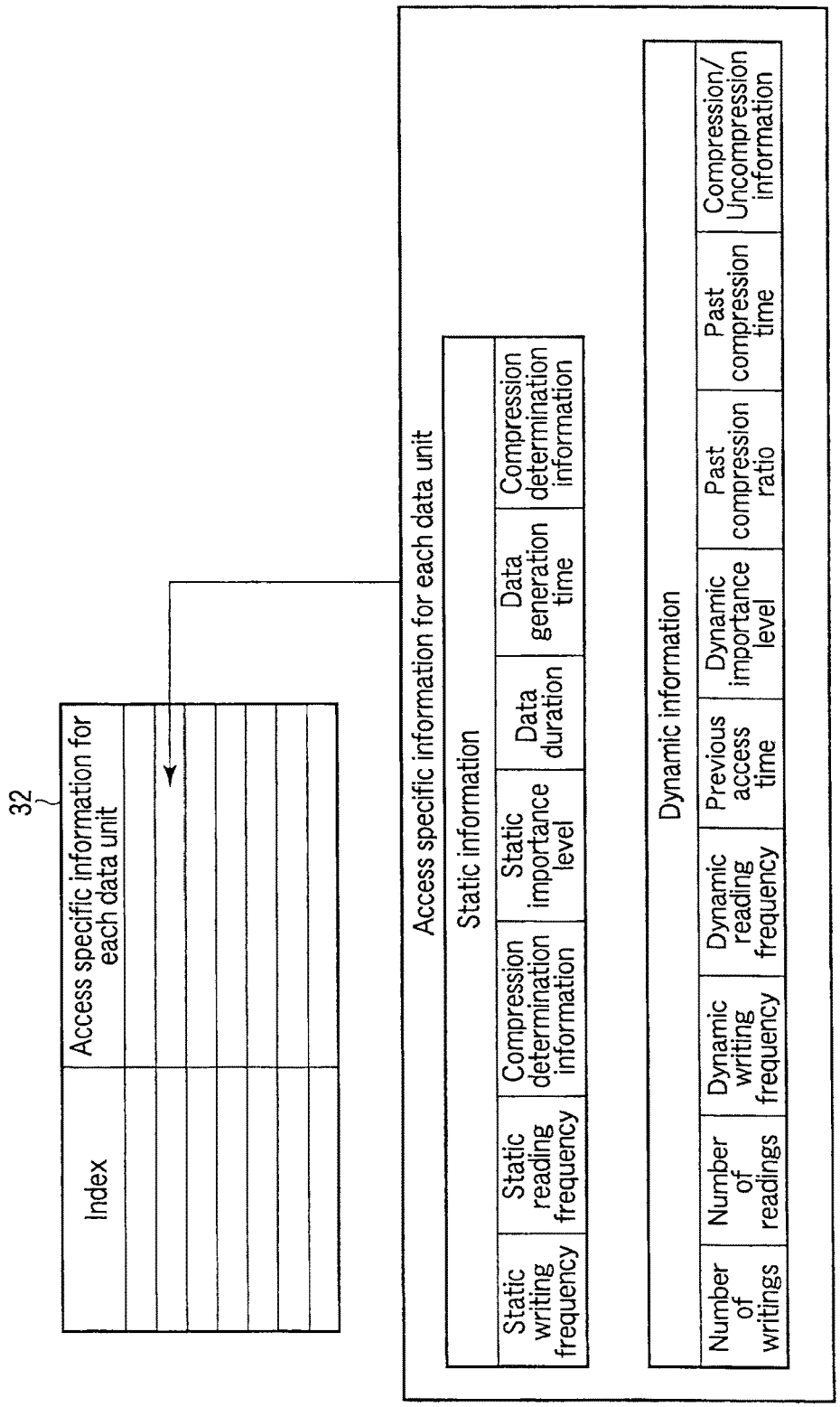
FIG. 13 is a block diagram showing an example of a format of a coloring table according to a second embodiment.

FIG. 13 is a block diagram showing an example of a format of a coloring table.

In the present embodiment, access specific information for each data is stored in each entry of a coloring table 32.

Dynamic information in the access specific information includes the past compression ratio and past compression time.

The past compression ratio is calculated by, for example, (data size after compression/data size before compression)× 100.

The past compression time is, for example, a time (or a compression speed for the write data) required from the start to end of compression in past compression processing.

The past compression ratio and the past compression time are set in the dynamic information by, for example, the operating system 13.

Of the past compression ratio and the past compression time, the past compression ratio is used in the case described below.

FIG. 14 is a flowchart showing an example of compression determination processing and compression processing according to the present embodiment.

In FIG. 14, step U5a is added before step U5 for compressing the write data 181 and writing the compressed data into the composite memory 5.

In step U5a, the compression determination unit 22 determines whether the past compression ratio of the write data 181 is beyond an allowable compression ratio (threshold: e.g., 80%).

When the past compression ratio of the write data 181 is beyond the allowable compression ratio, the process moves to step U2. As a result, the write data 181 is stored in a selected region of the composite memory 5 without being compressed.

When the past compression ratio of the write data 181 is equal to or less than the allowable compression ratio, the process moves to step U5. As a result, the write data 181 is compressed and stored in a selected region of the composite memory 5.

Furthermore, in FIG. 14, step U5b is added after step U5 for compressing the write data 181 and writing the compressed data in the composite memory 5.

In step U5b, the operating system 13 calculates the compression ratio of the compressed write data 181, and updates the past compression ratio of the write data 181.

In the present embodiment, the past compression time may be used instead of the past compression ratio. In this case, the compression determination unit 22 determines whether the past compression time of the write data 181 is beyond an allowable compression time (threshold).

When the past compression time of the write data 181 is beyond the allowable compression time, the write data 181 is stored in a selected region of the composite memory 5 without being compressed.

When the past compression time of the write data 181 is equal to or less than the allowable compression time, the write data 181 is compressed and stored in a selected region of the composite memory 5.

Alternatively, both the past compression ratio and the past compression time may be used in the present embodiment. For example, when the past compression time is beyond the set allowable compression time or when the past compression ratio is beyond the set allowable compression ratio, the memory management device 4 according to the present embodiment does not compress the write data 181. When the past compression time is equal to or less than the allowable compression time and when the past compression ratio is equal to or less than the allowable compression ratio, the memory management device 4 compresses the write data 181.

In FIG. 14, step U5a may be performed before step U1.

In the present embodiment described above, the dynamic information in the coloring table 32 further includes at least one of the past compression ratio and the past compression time.

When the data is compressed and written, the past compression ratio is a value calculated by (data size after compression/data size before compression)×100.

The past compression time is a time from a data compression start point to a data compression end point when data is compressed and written.

The past compression ratio and the past compression time are stored in the coloring table 32.

In response to a data write request, the memory management device 4 determines whether to compress write data by, for example, the processing shown in FIG. 13.

In addition to the characteristics of the memory management device 4 according to the first embodiment described above, the memory management device 4 according to the present embodiment has the following characteristic: The memory management device 4 according to the present embodiment refers to at least one of the past compression ratio and the past compression time before data is compressed and written. When at least one of the past compression ratio and the past compression time is beyond the threshold, the memory management device 4 determines that compression is not effective, and writes the uncompressed write data 181 into a selected region of the composite memory 5. When the past compression ratio and the past compression time are equal to or less than the thresholds, the memory management device 4 according to the present embodiment writes the compressed write data 181 into a selected region of the composite memory 5, and updates the past compression ratio and the past compression time in the coloring table 32.

According to the present embodiment, even if, for example, the type of the file corresponding to the write data 181 cannot be recognized, data can be effectively compressed by referring to the past compression ratio and the past compression time. Thus, it is possible to prevent ineffective data compression, reduce unnecessary compression time, reduce the size of the write data, and prolong the lifetime of the composite memory 5.

Moreover, by referring to the past compression time, data compression requiring a long compression time can be reduced, and delay of processing can be prevented.

Although the past compression ratio and the past compression time are used in the example described according to the present embodiment, a past expansion ratio and a past expansion time may be used instead of the past compression ratio and the past compression time.

Third Embodiment

In a third embodiment, a modification of the memory management device 4 according to the first and second embodiments is described.

For example, the memory management device 4 comprises a cache memory functioning as write-back cache memory. The memory management device 4 stores data (e.g., pages) written into the composite memory 5 up to a given amount (e.g., a block size). When the written data reaches the given amount, the memory management device 4 collectively writes the data stored in the cache memory into the composite memory 5. In this case, the above-described compression determination processing and compression processing are performed in the background.

As a result, the number of times of writing from the memory management device 4 to the composite memory 5 can be reduced.

For example, the memory management device 4 does not compress data high in reading frequency or writing frequency but compresses data low in reading frequency or writing frequency.

For example, the memory management device 4 has a lifetime priority mode for compressing all data in files for which compression is effective, and an access speed priority mode for compressing data having an access frequency equal to or less than a threshold and not compressing data having an access frequency higher than the threshold. The memory management device 4 chooses whether to compress data in accordance with a set mode.

For example, the memory management device 4 may compress data when the remaining capacities of the nonvolatile semiconductor memories 5b and 5c of the composite memory 5 are beyond a given amount or rate.

For example, the memory management device 4 may not compress data stored in the SLC nonvolatile semiconductor memory 5b of the composite memory 5 and may compress data stored in the MLC nonvolatile semiconductor memory 5c. On the contrary, the memory management device 4 may compress data stored in the SLC nonvolatile semiconductor memory 5b of the composite memory 5 and may not compress data stored in the MLC nonvolatile semiconductor memory 5c.

For example, the memory management device 4 may determine whether there are any remaining number of writings (or the number of readings or erasings) in the nonvolatile semiconductor memories 5b and 5c of the composite memory 5 before the upper limit of the number of writings (or the upper limit of the number of readings or erasings). If there are any remaining number of writings, the memory management device 4 may not compress data. If not, the memory management device 4 may compress data. Whether there are any remaining number of writings before the upper limit of the number of writings is determined by, for example, whether or not an amount of the use of the memory found by (the number of writings/the upper limit of the number of writings) is equal to or less than a threshold.

In the embodiments described above, whether to compress data read from a file (data corresponding to the file) is determined by, for example, a file list, the extension of the file and the header of the file.

Furthermore, in accordance with the compression ratio, compression time, number of accesses and access frequency that are dynamically found, the memory management device 4 according to the embodiments described above also determines whether to compress data which cannot be determined by the file list, the extension of the file and the header of the file as to whether compression is needed; for example, data stored in a bss area, stack area and heap area of the main memory by a kernel of the operating system 13.

In the embodiments described above, when the nonvolatile semiconductor memories 5b and 5c of the composite memory 5 are used as the main memory, the memory region used for stacking during program execution, for example, is high in update frequency. In contrast, there is a little rewriting in the memory region used for a program code region.

Thus, for example, the memory management device 4 does not compress data written into the memory region which is used for stacking during program execution, and compresses data written into the memory region which is used for the program code region. As a result, the compression time and expansion time in the access to the region high in update frequency are eliminated, thereby enabling high-speed operation and the reduction of the amount and capacity of the use of the region low in update frequency.

Furthermore, for example, when a DRAM is used as the cache memory, the memory management device 4 manages data to give priority to the stack area over the program code region so that the stack area remains in the cache memory during cache interchange.

For example, the memory management device 4 may change the order of priority in determining whether to compress data stored in the region used or allocated by the kernel and data stored in the region used or allocated by a user process.

For example, in accordance with the order of priority of a process, the memory management device 4 determines whether to compress data which is written by this process.

As described above, in the present embodiment, it is possible to determine, in accordance with the characteristics of the information processing device 1, whether to compress data on the basis of data written into the composite memory 5 by various standards.

Fourth Embodiment

In a fourth embodiment, which of the memories 5a to 5c included in the composite memory 5 according to the first and third embodiments to select as an access destination is described in more detail.

The memory management device 4 performs writing into or reading from the volatile semiconductor memory 5a, the SLC nonvolatile semiconductor memory 5b and the MLC nonvolatile semiconductor memory 5c.

The memory management device 4 performs the wear leveling to smooth at least one of the number of readings and the number of writings in each of the nonvolatile semiconductor memories 5b and 5c.

The information processing device 1 executes the operating system 13. The information processing device 1 manages the data specific information 201 to 20n by the operating system 13.

For the data (or programs) 181 to 18n, the data specific information 201 to 20n includes access information specific to data, for example, at least one of the access frequency and the number of accesses.

That is, the data specific information 201 to 20n is associated with the data main portions 191 to 19n of the data 181 to 18n handled in the information processing device 1.

When the data 181 to 18n are written or read, the operating system 13 updates the data specific information 201 to 20n for the data 181 to 18n.

The information processing device 1 manages the memory usage information 14 by the operating system 13.

The memory usage information 14 includes information that indicates the use of the memories 5a to 5c, such as the amount and rate of the use of the memories 5a to 5c and the amount and rate of the use of the regions in the memories 5a to 5c. For example, the memory usage information 14 includes, for example, "the number of accesses/the upper limit of the number of accesses" to each of the memories 5a to 5c, "the number of accesses/the upper limit of the number of accesses" to each of the regions in the memories 5a to 5c, "the used capacity/the total capacity" of each of the memories 5a to 5c, and the number and frequency of accesses to each of the regions in the memories 5a to 5c. For example, when the composite memory 5 is accessed, the operating system 13 updates the memory usage information 14, for example, the amount or rate of the use of the accessed memory, the amount or rate of the use of the accessed region, the number of accesses, and the access frequency.

The memory specific information 15 includes information specific to the memories, for example, the upper limit of the number of accesses to the memories 5b and 5c of the composite memory 5 (lifetime information or durability information).

The coloring table 17 manages the access specific information indicating the states of accesses to the data 181 to 18n.

The memory management device 4 checks the coloring table 17 at the time of writing the data 181, and selects one of the memories 5b and 5c of the composite memory 5 as a writing destination memory. As a result of this selection, it is possible to use a high-performance, inexpensive and high-capacity memory for a long time. For example, the memory management device 4 selects a memory having enough writing durability in accordance with the coloring table 17.

For example, when the access frequency of the write data 181 is high, the memory management device 4 selects the SLC nonvolatile semiconductor memory 5b as a writing destination. When the access frequency of the write data 181 is low, the memory management device 4 selects the MLC nonvolatile semiconductor memory 5c as a writing destination. As a result, the cost, performance, access speed and lifetime of the composite memory 5 can be optimized.

When one of the SLC nonvolatile semiconductor memory 5b and the MLC nonvolatile semiconductor memory 5c is selected, the memory management device 4 writes the write data 181 into the selected write memory in accordance with the wear leveling or an incremental writing algorithm, as has been described in the embodiments described above.

The composite memory 5 according to the present embodiment is a main memory in which different types of memories are mixed. In order to maximize the lifetime of the composite memory 5 and to avoid any data loss, the memory management device 4 decides the arrangement of data by the durability and reliability of the memories 5b and 5c of the composite memory 5.

The memory management device 4 according to the present embodiment obtains a coloring level (evaluation value) in accordance with the access frequency and importance level of data to be accessed.

The memory management device 4 then selects a writing destination memory from the memories 5b and 5c in accordance with the coloring level and the usage rates (e.g., the number of writings/the upper limit of the number of writings, or the used capacity/the total capacity) of the memories 5b and 5c of the composite memory 5.

The importance level of data is decided by, for example, format information for a data file, set information set by the user, and access time information for the data.

For example, the importance level is determined by whether data is in an executable file or media file and by the type of the folder in which the data file is saved.

Whether data is an executable file is determined by the execution permission of the file. For example, when the data is an executable file, high importance level is set.

The media file is determined by the extension of the file. For example, when the data is a media file, middle importance level is set.

For example, when the folder in which the data file is saved is a trash box or mailbox, low importance level is set.

When the importance level of the data file is set by the user, setting of the importance level of each file is stored in a shadow file having a different extension. The user may be informed of the setting of the importance level by a system call.

For example, the importance level may decrease in proportion to the interval between the last access time and a current time.

The importance level includes static importance level which does not change in value, and dynamic importance level which changes in value with access conditions.

The access frequency of data is decided by, for example, the order of priority of a process, file format information, an access pattern, and ELF format segment.

For example, a low writing frequency is set for a media file.

For example, when the access pattern is a permission designated by the system call, a high access frequency is set. When the access pattern is a permission of a file, a low access frequency is set.

For example, for a segment comprising read-only sections, a low writing frequency is set in the access frequency.

The access frequency includes a static access frequency which does not change in value, and a dynamic access frequency which changes in value with access conditions.

The memory management device 4 calculates the coloring level in accordance with, for example, Equation (1), the importance level and the access frequency.

$$CL = \min(9, (\text{importance level} \times W + \text{access frequency} \times (1-W))) \quad (1)$$

Here, W is a correction value for weighting the importance level and the access frequency. The range of W is $0 \leq W \leq 1$.

In Equation (1), the range of a coloring level CL is $0 \leq CL \leq 9$.

A specific example of deciding the importance level is described below.

For example, the importance level of a parameter region used in the kernel is a fixed value, and is set at 9. The importance level of a region required during process generation is a fixed value, and is set at 9. The importance level of the region dynamically required for a process is a fixed value, and is set at 5.

FIG. 15 is a graph showing an example of calculating the dynamic importance level.

The range of the importance level of the region for the process to map a file in the main memory is $0 \leq \text{importance level} \leq 9$. This importance level is set by Equations (2) to (4).

$$\text{Importance level} = \min(9, \max(\text{dynamic importance level} \times \text{importance level specified by user})) \quad (2)$$

$$\text{Dynamic importance level} = \text{static importance level} \times T \quad (3)$$

$$T = \max(0, -(1/\text{maximum access time interval}) + 1) \quad (4)$$

Here, the range of the static importance level is $0 \leq \text{static correction value} \leq 9$. The static importance level is experimentally set on the basis of a data format.

The maximum access time interval is experimentally set, or found from an access history.

A specific example of deciding the access frequency is described below.

For example, the access frequency of the parameter region used in the kernel is a fixed value, and is set at 9.

For example, the access frequency of the region used in a process is set in accordance with the access pattern. For example, 3 is set for a read-only region, and 5 is set for a region which has a possibility of writing in addition to a possibility of reading.

For example, the access frequency may be found in accordance with the number of accesses and time information in order to effectively arrange data.

A specific example of deciding a threshold used to select a writing destination memory is described below.

FIG. 16 is a graph showing an example of the relation among the coloring level, the memory usage rate and the threshold.

In the present embodiment, a writing destination memory is selected from the different types of memories 5a to 5c in the composite memory 5 in accordance with the coloring level. In the present embodiment, the threshold of the coloring level used to select the writing destination memory is changed in accordance with the memory usage rate. For example, the usage rate may be "the number of accesses/the upper limit of the number of accesses" or may be "the capacity of the used region/the total capacity of the memory". Moreover, the threshold may be changed in accordance with an available remaining capacity or available remaining rate.

A threshold ONRAM is used to determine whether to store data in the volatile semiconductor memory 5a. When the coloring level of the write data 181 is equal to or more than the threshold ONRAM, the volatile semiconductor memory 5a is selected as the writing destination memory. When the coloring level of the write data 181 is below the threshold ONRAM, one of the nonvolatile semiconductor memories 5b and 5c is selected as the writing destination memory.

The threshold ONRAM is calculated by Equation (5), and the figures after the decimal point are dropped. The range of the threshold ONRAM is $6 \leq \text{ONRAM} \leq 9$.

$$\text{ONRAM} = \min(9, (9/100 \times \text{memory usage rate (\%)} + 6)) \quad (5)$$

In Equation (5), 6 is the minimum value of the threshold ONRAM.

Furthermore, a threshold ONSLC is used to determine whether to store data in the SLC nonvolatile semiconductor memory 5b. When the coloring level of the write data 181 is below the threshold ONRAM and is equal to or more than the threshold ONSLC, the SLC nonvolatile semiconductor memory 5b is selected as the writing destination memory. When the coloring level of the write data 181 is below the threshold ONSLC, the MLC nonvolatile semiconductor memory 5c is selected as the writing destination memory.

The threshold ONSLC is calculated by Equation (6), and the figures after the decimal point are dropped. The range of the threshold ONSLC is $3 \leq \text{ONSLC} \leq 5$.

$$\text{ONSLC} = \min(9, (9/100 \times \text{memory usage rate (\%)} + 3)) \quad (6)$$

In Equation (6), 3 is the minimum value of the threshold ONSLC.

For the write data 181, at least one of the access frequency and importance level is higher. The volatile semiconductor memory 5a, the SLC nonvolatile semiconductor memory 5b and the MLC nonvolatile semiconductor memory 5c are allocated in descending order of coloring level.

When the usage rate of the volatile semiconductor memory 5a is higher, data is less easily stored in the volatile semiconductor memory 5a and more easily stored in the nonvolatile semiconductor memories 5b and 5c.

When the usage rate of the SLC type nonvolatile semiconductor memory 5b is higher, data is less easily stored in the SLC nonvolatile semiconductor memory 5b and more easily stored in the MLC nonvolatile semiconductor memory 5c.

Figure 17:
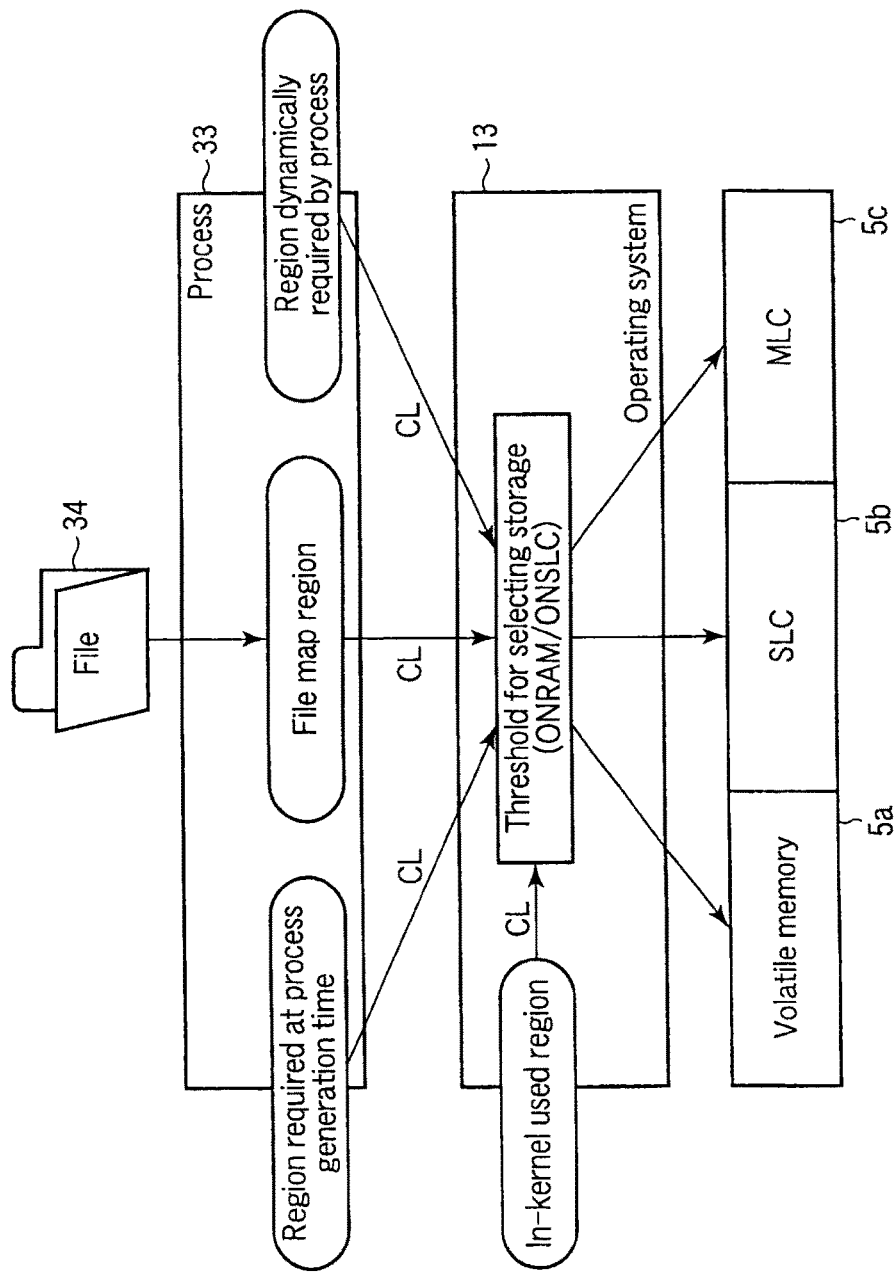
FIG. 17 is a block diagram showing an example of a relation between a process and the operating system.

FIG. 17 is a block diagram showing an example of the relation between a process and the operating system 13.

A process 33 is stored in a region required during process generation, a file map region corresponding to a file 34 or a region dynamically required by the process.

The operating system 13 stores data in the in-kernel used region.

The operating system 13 finds a coloring level of the write data 181 in accordance with whether the write data 181 is stored in the region required during process generation, the file map region, the region dynamically required by the process 33 or the in-kernel used region.

The operating system 13 determines the thresholds ONRAM and ONSLC in accordance with the usage rates of the volatile semiconductor memory 5a and the SLC nonvolatile semiconductor memory 5b.

Furthermore, the memory management device 4 and the operating system 13 select a memory to store in accordance with whether the coloring level is higher or lower than the thresholds ONRAM and ONSLC.

In the present embodiment described above, data can be efficiently arranged on the basis of the durability, lifetime and usage state of the composite memory 5.

In the examples described according to the embodiments described above, the composite memory 5 is used as the main memory. However, whether to compress data may be determined when the nonvolatile semiconductor memory is simply used as the main memory instead of the composite memory 5.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a first nonvolatile memory region, a second nonvolatile memory region, and a third nonvolatile memory region;
   a write memory selector configured to select one of the first nonvolatile memory region, the second nonvolatile memory region, and the third nonvolatile memory region for a writing operation based upon specific information respectively specified for each unit of data to be written in the writing operation including static data information and dynamic data information, wherein at least one category of the specific information has both static and dynamic values;
   a compressor configured to generate compressed write-data; and
   a write controller configured to write:
   based on that the first nonvolatile memory region is selected, uncompressed write-data to the first nonvolatile memory region,
   based on that the second nonvolatile memory region is selected, the compressed write-data to the second nonvolatile memory region, and
   based on that the third nonvolatile memory region is selected, one of the compressed write-data and the uncompressed write-data to the third nonvolatile memory region,
   wherein the specific information includes a plurality of categories and each of the categories includes both static and dynamic values.

2. The memory system according to claim 1, wherein the write memory selector selects one of the first nonvolatile memory region, the second nonvolatile memory region, and the third nonvolatile memory region based on the specific information for the write-data, and
   write-data for which the specific information is acquired has a data unit smaller than a file size.

3. The memory system according to claim 1, wherein the write memory selector selects one of the first nonvolatile memory region, the second nonvolatile memory region, and the third nonvolatile memory region based on information included in the specific-information indicating a type of a file in which write-data is included.

4. The memory system according to claim 1, wherein the write memory selector selects one of the first nonvolatile memory region, the second nonvolatile memory region, and the third nonvolatile memory region based on information included in the specific information indicating an address to which write-data is mapped.

5. The memory system according to claim 1, further comprising a compression determiner configured to determine whether to generate the compressed write-data based on at least one of access frequency information and selecting of the write memory selector.

6. The memory system according to claim 1, further comprising a compression determiner configured to determine whether to generate the compressed write-data based on selecting of the write memory selector,
   wherein the first nonvolatile memory region has a lower access latency compared to the second nonvolatile memory region, and the compression determiner determines not to generate the compressed write-data when the write memory selector selects the first nonvolatile memory region.

7. The memory system according to claim 1, wherein the first nonvolatile memory region is a SLC NAND memory, and the second and third nonvolatile memory regions are MLC NAND memories.

8. The memory system according to claim 1, further comprising:
   a compression determiner configured to determine whether to generate the compressed write-data based on access frequency information; and
   a holder which holds specific information for the write-data,
   wherein the specific information including access frequency information and compression determination information, and the compression determiner determines not to generate the compressed write-data if the access frequency information of the write-data is higher than a first value regardless of the compression determination information of the write-data.

9. The memory system according to claim 8,
   wherein the access frequency information includes the number of writings per unit time for the write-data.

10. The memory system according to claim 1, wherein the first nonvolatile memory region has a storage capacity smaller than that of the second nonvolatile memory region, and the second nonvolatile memory region has a storage capacity smaller than that of the third nonvolatile memory region.

11. The memory system according to claim 1, wherein the write memory selector selects one of the first nonvolatile memory region, the second nonvolatile memory region and the third nonvolatile memory region based on write frequency information for the write-data.

12. The memory system according to claim 1, wherein the static data information consists of fixed usage parameters of stored data and the dynamic information consists of variable usage parameters of the stored data.

13. The memory system according to claim 1, wherein the unit of data is a minimum unit of data for writing.

14. A memory system comprising:
a first nonvolatile memory region, a second nonvolatile memory region, and a third nonvolatile memory region;
a write memory selector configured to select one of the first nonvolatile memory region, the second nonvolatile memory region, and the third nonvolatile memory region for a writing operation based upon specific information respectively specified for each unit of data to be written in the writing operation including static data information and dynamic data information, wherein at least one category of the specific information has both static and dynamic values;
a compressor configured to generate compressed write-data;
a processor configured to update the specific information after the writing operation is conducted; and
a write controller configured to write, based on that the first nonvolatile memory region is selected for writing data, uncompressed write-data to the first nonvolatile memory region, and, based on that the second nonvolatile memory region is selected for writing data, the compressed write-data to the second nonvolatile memory region, and, based on that the third nonvolatile memory region is selected for writing data, one of the compressed write-data and the uncompressed write-data to the third nonvolatile memory region,
wherein the specific information includes a plurality of categories and each of the categories includes both static and dynamic values.

15. The memory system according to claim 14, wherein the write-data for which the specific information is acquired has a data unit smaller than a file size.

16. The memory system according to claim 14, wherein the specific information includes a type of a file in which the write-data is included.

17. The memory system according to claim 14, wherein the specific information includes an address to which the write-data is mapped.

18. The memory system according to claim 14, further comprising a compression determiner configured to determine whether to generate the compressed write-data based on at least one of access frequency information and selecting of the write memory selector.

19. The memory system according to claim 14, further comprising a compression determiner configured to determine whether to generate the compressed write-data based on selecting of the write memory selector,
wherein the first nonvolatile memory region has a lower access latency compared to the second nonvolatile memory region, and the compression determiner determines not to generate the compressed write-data when the write memory selector selects the first nonvolatile memory region for the write-data.

20. The memory system according to claim 14, wherein the first nonvolatile memory region is a SLC NAND memory, and the second and third nonvolatile memory regions are MLC NAND memories.

21. The memory system according to claim 14, further comprising a compression determiner configured to determine whether to generate the compressed write-data based on access frequency information,
wherein the specific information including compression determination information, and the compression determiner determines not to generate the compressed write-data if the change rate of the number of writings per unit time is higher than a first value regardless of the compression determination information of the write-data.

22. The memory system according to claim 14, wherein the static data information consists of fixed usage parameters of stored data and the dynamic information consists of variable usage parameters of the stored data.

23. The memory system according to claim 14, wherein the specific information includes a change rate of the number of writings per unit time for the write-data.

* * * * *